United States Patent [19]

Sasagawa et al.

[11] Patent Number: 4,949,213

[45] Date of Patent: Aug. 14, 1990

[54] DRIVE CIRCUIT FOR USE WITH VOLTAGE-DRIVE SEMICONDUCTOR DEVICE

[75] Inventors: Kiyoaki Sasagawa; Hiroshi Miki; Tadashi Miyasaka; Hideki Ninomiya, all of Kanagawa, Japan

[73] Assignee: Fuji Electric Co., Ltd., Kanagawa, Japan

[21] Appl. No.: 436,643

[22] Filed: Nov. 15, 1989

[30] Foreign Application Priority Data

| Nov. 16, 1988 | [JP] | Japan | 63-289231 |
| Dec. 22, 1988 | [JP] | Japan | 63-324359 |
| Mar. 20, 1989 | [JP] | Japan | 64-68821 |
| Apr. 20, 1989 | [JP] | Japan | 64-100569 |
| Jul. 12, 1989 | [JP] | Japan | 64-179497 |
| Jul. 14, 1989 | [JP] | Japan | 64-181771 |
| Aug. 8, 1989 | [JP] | Japan | 222642 |

[51] Int. Cl.⁵ .............................................. H02H 3/20
[52] U.S. Cl. ........................................ 361/91; 361/92; 307/296.4
[58] Field of Search ................ 361/86, 87, 91, 92, 361/98, 101; 307/296.4, 296.7

[56] References Cited

U.S. PATENT DOCUMENTS

| 4,408,245 | 10/1983 | Pryor | 361/91 X |
| 4,538,198 | 8/1945 | Imanishi et al. | 361/98 X |
| 4,774,620 | 9/1988 | Enomoto et al. | 361/91 |

Primary Examiner—Derek S. Jennings
Attorney, Agent, or Firm—Finnegan, Henderson, Farbow, Garrett, and Dunner

[57] ABSTRACT

In a common drive output circuit for driving dissimilar switching semiconductor devices having different drive input characteristics by turning on and off dc power supplies to apply a voltage between the drive input terminals of either one of the switching semiconductor devices through two transistors connected in a Darlington pair, the collector circuit of one of the two transistors which is not at the output stage has a diode inserted in series which has such a polarity as to permit passage of the collector current.

8 Claims, 18 Drawing Sheets

FIG. 11  PRIOR ART
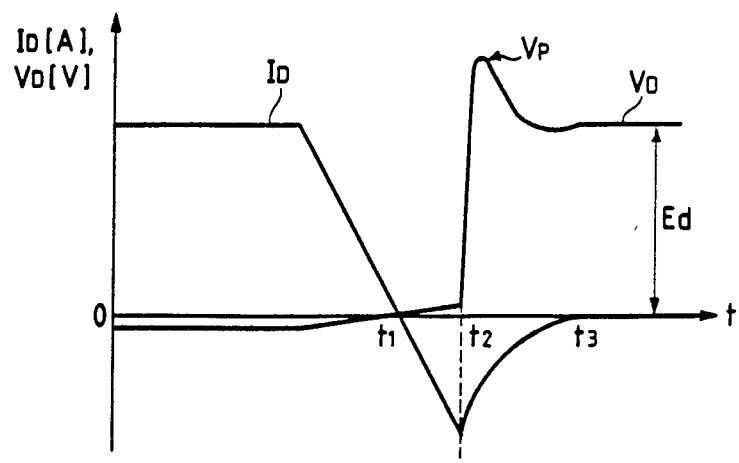
FIG. 12  PRIOR ART
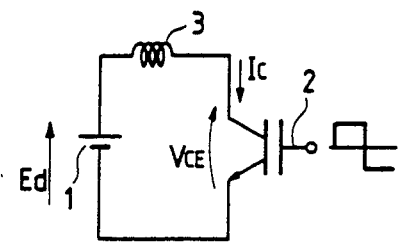
FIG. 13  PRIOR ART
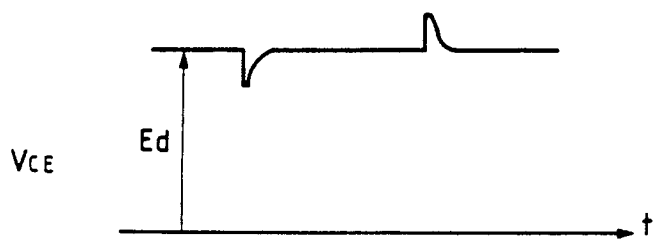
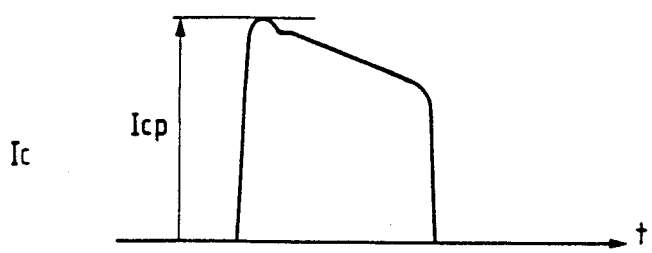

AT SHORT CIRCUIT

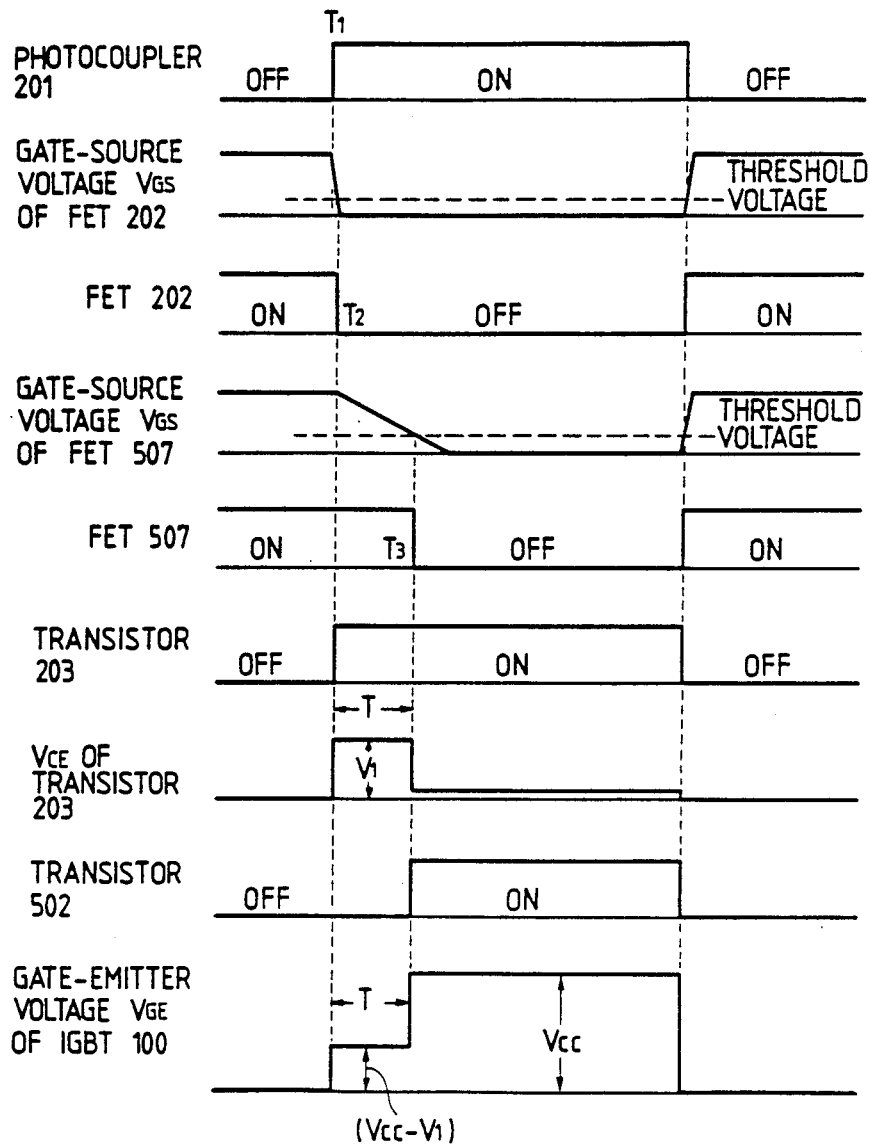

DRIVE CIRCUIT FOR USE WITH VOLTAGE-DRIVE SEMICONDUCTOR DEVICE

BACKGROUND OF THE INVENTION

The present invention relates to a drive circuit for use with voltage-driven semiconductor devices such as IGBTs (insultated-gate bipolar transistors) and power MOS FETs. The present invention also relates to a common output circuit for driving dissimilar switching semiconductor devices (power devices) having different drive input characteristics that are respectively composed of the IGBTs and the MOS FETs.

Power devices are usually driven with different circuits having configuration adapted for the drive input characteristics inherent in the individual devices.

FIGS. 1(A) and 1(B) illustrate the drive input characteristics of two dissimilar power devices; FIG. 1(A) shows illustrative waveforms of the base-emitter voltage VBE of a bipolar transistor and the corresponding base current IB, and FIG. 1(B) shows illustrative waveforms of the gate-emitter voltage VGE of an IGBT and the corresponding gate current IG. FIG. 2 shows a circuit for driving the bipolar transistor and FIG. 3 shows a circuit for driving the IGBT.

The circuit shown in FIG. 2 includes a bipolar transistor QB as the power device to be driven, a forward drive dc power supply VCC, a reverse drive dc power supply VEE, a forward drive output stage transistor GF, and a reverse drive output stage transistor QR.

When a "High" ("H") drive signal VD is supplied, it is inverted by a NOT gate N1 and turns one photocoupler PC1 on while turning the other photocoupler PC2 off. As a result, a base current is supplied to the forward drive output stage transistor QF through the path consisting of dc power supply VCC, phototransistor PT1 in photocoupler PC1, the base-emitter of output state transistor QF, the base-emitter of bipolar transistor QB and dc power supply VCC, and output stage transistor QF is thus turned on whereas the other output stage transistor QR for reverse drive is turned off. Hence, a base current IB1 as a forward drive current is supplied to bipolar transistor QB through the path consisting of dc power supply VCC, forward base current limiting resistor RF, the collector-emitter of output stage transistor QF, the base-emitter of bipolar transistor QB, and dc power supply VCC, and the bipolar transistor QB is thus turned on.

If the drive signal VD is at a "Low" ("L") level, photocoupler PC1 turns off and photocoupler PC2 turns on. As a result, the forward output stage transistor QF is turned off and a base current is supplied to the reverse drive output stage transistor QR through the path consisting of dc power supply VEE, the emitter-base of bipolar transistor QB, the emitter-base of output stage transistor QR, phototransistor PT2 in photocoupler PC2, and dc power supply VEE, and the output stage transistor QR turns on. Hence, a base current IB2 as a reverse drive current is supplied to bipolar transistor QB through the path consisting of dc power supply VEE, the emitter-base of bipolar transistor QB, the emitter-collector of output stage transistor QR, reverse base current limiting resistor RR, and dc power supply VEE, and the bipolar transistor QB is thus turned off.

In the circuit shown in FIG. 3, when a "H" drive signal VD is supplied, photocoupler PCO turns on whereas auxiliary transistor Q10 turns off. As a result, reverse output stage transistor QR turns off and a base current is supplied to forward output stage transistor QF through the path consisting of dc power supply VCC, resistor R2, the base-emitter of output stage transistor QF, the gate-emitter of IGBT QI, and dc power supply VCC, thereby causing the forward output stage transistor QF to turn on. Hence, a forward drive voltage from dc power supply VCC is applied between the gate and emitter of IGBT QI through resistor RF to turn IGBT QI on.

If the drive signal VD is at a "L" level, photocoupler PCO turns off whereas auxiliary transistor Q10 turns on. As a result, forward output stage transistor QF turns off and a base current is supplied to reverse output stage transistor QR through the path consisting of dc power supply VEE, the emitter-gate of IGBT QI, the emitter-base of output stage transistor QR, auxiliary transistor Q10, and dc power supply VEE, and the reverse output stage transistor QR turns on. Hence, a reverse drive voltage from dc power supply VEE is applied between the gate and emitter of IGBT QI through resistor RR to turn IGBT QI off.

Turning back to FIG. 1, a bipolar transistor is a current-driven device as shown in FIG. 1(A) and in order to keep it in conduction, a base current must be kept supplied in an amount sufficient to compensate for the collector current. When turning off the conducting device, the base is supplied with a reverse bias current larger than the forward bias base current in order to shorten the time required for turning the device off. The forward bias base current could theoretically be reduced by connecting a plurality of bipolar transistors QB in Darlington configuration as shown in FIG. 4 (where three bipolar transistors are connected). In practice, however, this is difficult to achieve since the value of reverse bias base current must comply with the ratings of bipolar transistor Q3 at the final stage of the Darlington connection (See FIG. 4). Thus, the base current of bipolar transistors will typically assume the wave form indicated by IB in FIG. 1(A) (if they are connected in a three-stage Darlington configuration). Subsequent to $t=t_1$, transistor Q3 at the final stage of the Darlington connection (FIG. 4) will restore the base-emitter junction and the reverse bias base current will flow through resistor RBE (FIG. 4) connected in parallel between the base and emitter of Q3. The value of this base current is extremely small (e.g. 50 mA). In order to insure that the transistors remain off throughout the period subsequent to $t_1$, a reverse bias voltage of approximately one volt is desirably applied between the base and emitter of final stage transistor Q3.

In contrast with the bipolar transistor, IGBT is a voltage-driven device as shown in FIG. 1(B) and in order to turn it on with an adequately low voltage, it is effective to increase the gate voltage as much as possible within the permissible range. In order to turn the IGBT off, a negative voltage is applied between the gate and emitter and the charge in the input capacitance is removed. Hence, the drive voltage of IGBT will typically assume the waveform indicated by VGE in FIG. 1(B). Since the gate of IGBT seen from the drive circuit is equivalent to a capacitive load, the gate current IG is produced by charging and discharging cycles of the input capacitance through a gate series resistor as shown in FIG. 1(B). The absolute values of the positive and negative peaks of gate current IG are equal and the duration of its passage, which may be considered in terms of the time constant determined by the value of gate series resistor and the input capacitance, is as short as 1 μsec or below. Therefore, if the IGBT is to be used at switching frequencies below 20 kHz, the heat generation of output stage transistors QF and QR in the drive circuit can safely be neglected for practical purposes.

As is clear from FIGS. 2 and 3, the basic compositions of output stage transistors QF and QR in the drive circuit are not much different between the driven power device QB (bipolar transistor) and QI (IGBT), except for the configuration of the output stage transistors QF and QR (whether they are connected in Darlington configuration or used singly) and the amount of resulting power loss. Compare, for example, the case of driving a bipolar transistor QB of 50 A class (composed of three transistors in Darlington configuration) with the case of driving IGBT QI. Typical waveforms of currents used to drive QB and QI are shown in FIG. 5. If a common output circuit is to be used to drive both types of device, a maximum collector current of forward drive current supply transistor (QF in FIGS. 2 and 3) is determined by the condition for driving IGBT (0.8 A in the case being considered), and the power loss that will occur in this supply transistor QF is determined by the output current for driving bipolar transistor QB (50 mA in the case being considered) and the saturation voltage of transistor QF in that output stage. On the other hand, a maximum collector current of the transistor for withdrawing the reverse current from the power device being driven (QR in FIGS. 2 and 3) is determined by the maximum value of the reverse bias current of the bipolar transistor (−1 A in the case being considered), and the power loss that will occur in this withdrawing transistor QR is determined by the reverse bias (base) current containing the current flowing through resistor RBE connected in parallel between the base and emitter of Q3 (see FIG. 4) during reverse biasing of bipolar transistor QB and by the saturation voltage of the withdrawing transistor for the case where said small current is allowed to flow as its own collector current.

It should be noted here that the saturation voltage of withdrawing transistor QR which occurs when it is supplied with a small collector current is restricted by the voltage value of dc power source VEE for supplying a reverse bias current to the bipolar transistor. This reverse bias voltage is illustrated in FIG. 4. FIG. 4(A) is a connection diagram for the case where bipolar transistor QB as a power device that consists of three transistors connected in Darlington configuration is reverse biased with reverse current withdrawing transistor QR1 as a reverse drive transistor that consists of two transistors connected in Darlington configuration, and FIG. 4(B) is the equivalent circuit of FIG. 4(A).

In order that a reverse voltage VBE of about one volt is applied between the base and emitter of transistor Q3 at the final stage of bipolar transistor QB in the Darlington connection after it has restored the base-emitter junction, the following relationship must be satisfied:

$$VBE = VCE + VF(SUD1) + VF(SUD2) - VEE$$
$$= -1(V) \qquad (1)$$

where VCE is the collector-emitter voltage of transistor 2B at the output stage of withdrawing transistor QR1; VF(SUD1) is the forward voltage drop in diode SUD1 connected anti-parallel between the base and emitter of transistor Q1 in bipolar transistor QB; and VF(SUD2) is the forward voltage drop in diode SUD2 connected anti-parallel between the base and emitter of transistor Q2 in bipolar transistor QB. As one can see from equation (1), the higher the saturation voltage VCE of the withdrawing transistor QR1 in the drive circuit, the higher the value of VEE that is necessary. In addition, the higher the saturation voltage VCE, the greater the power loss that should occur in this mode.

As already mentioned, power devices are usually driven with different circuits depending upon the input characteristics of the specific device to be driven. The present invention intends to design a single common drive circuit for the purpose of realizing an IC package that is capable of driving and controlling various types of power devices. The drive circuits for power devices should handle fairly large currents, so one of the problems that have to be dealt with in putting the drive circuits inside a single IC package is the power loss that occurs in the package. As already mentioned, in order to make a single drive circuit that can be used with both a bipolar transistor and an IGBT, the circuit performance must satisfy the following conditions: transistors at the output stage of the drive circuit can be supplied with a current having a high peak value within a short period of time, with the same base current flowing; and a small current can be supplied for a prolonged period without generating much heat. In other words, the transistors at the output stage must have a low saturation voltage within the range of small drive output currents. In order to satisfy the first condition, the drive transistors at the output stage must be connected in Darlington configuration but the Darlington connection has an increased overall saturation voltage, which leads to greater power loss.

Next, conventional drive circuits for voltage-driven semiconductor devices such as IGBT will be described.

An equivalent circuit of such IGBT is shown in FIG. 6 and comprises an N channel MOS FET 101, an NPN transistor 102, a PNP transistor 103, and a resistor 104 for shorting the base and emitter of transistor 102. These components combine together to make an IGBT 100 having a gate G, a collector C and an emitter E. Transistors 102 and 103 also make up a parasitic thyristor circuit.

FIG. 7 shows a conventional circuit for driving IGBT 100 which comprises a signal insulating photocoupler 201 connected to a control circuit such as a PWM circuit (not shown), an N channel MOS FET 202, an NPN transistor 203, a PNP transistor 204, a forward bias supply source 205, a reverse bias supply source 206, and resistors 207, 208 and 209.

Using this drive circuit, IGBT 100 is turned on by the following procedure. When photocoupler 201 is energized on its primary side, it turns on, causing FET 202 to turn off. As FET 202 turns off, transistor 204 turns off, causing transistor 203 to turn on. When transistor 203 turns on, forward bias supply source 205 applies a voltage between the gate and emitter of IGBT 100 via resistor 209, thereby turning IGBT 100 on.

IGBT 100 is turned off by reversing the operation described above. When the current flowing to the primary side of photocoupler 201 is cut off, it turns off, causing FET 202 to turn on. As a result, transistor 203 turns off and transistor 204 turns on, whereupon reverse bias supply source 206 applies a voltage between the gate and emitter of IGBT 100 via resistor 9, thereby turning IGBT 100 off. Besides limiting the gate current of IGBT 100, resistor 209 ensures that the internal parasitic thyristor will not turn on (a phenomenon called "latch-up") when IGBT 100 is turned off, to have the gate lose its control ability for cutting off the current.

FIG. 8 shows another circuit for driving IGBT 100. This circuit includes a constant-voltage diode 210, a resistor 211 and an NPN transistor 212, with the other components being the same as shown in FIG. 7. The drive circuit shown in FIG. 8 operates in substantially the same way as the circuit shown in FIG. 7, and transistor 212 serves the same function as FET 202 in FIG. 7.

IGBTs of the type described above are chiefly used as a switch for turning on and off the current flowing to an inductive load such as a VVVF (variable voltage, variable frequency) inverter. The basic operation of the IGBT used as a switch is essentially the same as the operation of a chopper in the inverter circuit shown in FIG. 9 which comprises IGBTs 100a and 100b, a dc power source 301 (voltage, Ed), reflux diodes 302 and 304, a wiring inductance 303, and a load 305, with a snubber circuit being omitted.

When IGBT 100a in the upper arm shown in FIG. 9 turns off as a result of the operation of the drive circuit in the manner described above, load current $I_L$ continues to flow through reflux diode 304 in the lower arm. When IGBT 100a turns on with $I_L$ kept flowing through 304, a short circuit composed of dc power source 301, IGBT 100a and reflux diode 304 is formed to create a dc short-circuited state until reflux diode 304 turns off. Thus, high-speed diodes are normally used as reflux diodes 304 and 302.

When IGBT 100a turns on, its collector current Ic and the load current $I_L$ will increase gradually as shown in FIG. 10. Considering a very short duration of time including $t_0$ when IGBT 100a turns on, current $I_D$ flowing through reflux diode 304 decreases abruptly just before $t_0$ and thereafter increases again abruptly as shown in FIG. 10. The profiles of current $I_D$ and the voltage $V_D$ that develops across the reflux diode 304 are shown more clearly in FIG. 11. The decreasing $I_D$ becomes zero at time $t_1$, thereafter increases in negative direction until it peaks at time $t_2$ (corresponding to $t_0$ in FIG. 10) and then becomes zero again at time $t_3$. The period from $t_1$ through $t_2$ to $t_3$ is commonly referred to as a "reverse recovery time". This reverse recovery time is very short and is usually within a microsecond.

With prior art semiconductor devices which have a longer switching time than the reverse recovery time, the abrupt changes of voltage and current that occur within the reverse recovery time have been suppressed by the switching time. However, the switching time of voltage-driven semiconductor devices such as IGBT are approximately equal to the reverse recovery time of diodes, so that the changes of voltage and current that occur within the reverse recovery time will not be suppressed but will simply increase further on.

In the period of $t_2$ to $t_3$, the reverse current (reverse recovery current) will decrease so abruptly that the rate of change of current (dI/dt) will increase. The faster the operation of diodes, the shorter the period of $t_2$ to $t_3$ and hence the greater the value of dI/dt. As a result, a voltage of the same polarity as that of the dc supply voltage Ed, $\Delta V = ls \cdot dI/dt$ (ls is the inductance value of wiring inductance 303), which is generated by dI/dt and wiring inductance 303 is superposed on Ed, and voltage $V_D$ across the reflux diode 304 will become very high as indicated by $V_P$ in FIG. 11. The value of $V_D$ may sometimes exceed the Withstand voltage of the device of interest and IGBT 100b connected parallel to reflux diode 304 can break or erroneously turn on.

Subsequent to time $t_2$, voltage $V_D$ will increase abruptly in a very short time and hence the rate of change of voltage (dV/dt) will also become very high, for example, more than $10 \times 10^3$ V/$\mu$s, causing erroneous operation of the photocoupler 201 in the drive circuit shown in FIGS. 7 and 8 or of the control circuit on the input side of said photocoupler. If, in order to cope with this problem, one uses a photocoupler that is less sensitive to the change in voltage (dV/dt) and which is capable of high-speed signal transmission the drive circuit for IGBT becomes expensive, leading to an increase in the production cost.

Next, a conventional drive circuit having a capability for protecting voltage-driven semiconductor devices from overcurrent that may flow when ground fault and other shorting accidents occur in power converting apparatus such as an inverter, will be described.

While various overcurrent faults occur accidentally during the operation of power converting apparatus such as an inverter, shorting of loads and ground fault can lead to the destruction of voltage-driven semiconductor devices used in the apparatus. With IGBT taken as an example of voltage-driven semiconductor devices, FIG. 12 shows an equivalent circuit for a shorting accident that occurs in a power converting apparatus and FIG. 13 shows the voltage and current waveforms generated from the voltage-driven semiconductor device used in that apparatus.

During the shorting period, a short-circuit current will flow with a substantially dc circuit voltage being applied to IGBT 2 (see FIG. 12). The other components of the circuit shown in FIG. 12 are a dc power source 1 and wiring inductance 3.

The short-circuit current can be as large as 5 to 6 times (or even 10 times in high-voltage withstanding devices) the rated dc current. Thus, an extremely large instantaneous power will be applied to the device during the accident and it is necessary to cut off the overcurrent by turning off the gate within a prescribed time (about 10 $\mu$s) after the short-circuit has been sensed.

A prior art drive circuit having a capability for protecting voltage-driven semiconductor devices from overcurrent is shown in FIG. 14. The circuit includes an IGBT 4 as a main switching element, a signal insulating photocoupler 5, an ON gate voltage supply source 6, and an OFF gate voltage supply source 7. The two voltage sources 6 and 7 are connected to a pair of transistors 9 and 10 that operate in a complementary manner with photocoupler 5 in response to a signal supplied therefrom via transistor 8. The emitters of these transistors 9 and 10 at the output stage are connected to the base of IGBT 4 via resistor 11, and the junction between voltage sources 6 and 7 is connected to the emitter of IGBT 4 to make a drive section.

Transistor 14, zener diode 13, diode 15 and resistor 17 make up an overcurrent sensing section that monitors the voltage at the collector terminal of IGBT 4 and which produces a certain signal if said voltage exceeds a predetermined level.

A delay circuit is formed of a capacitor 16 upstream of the overcurrent sensing section.

The normal operation of the circuit shown in FIG. 14 will proceed as follows. When photocoupler 5 turns on, transistor 8 turns off, as a result of which transistor 9 turns on whereas transistor 10 turns off to apply ON gate voltage $V_1$ between the gate and emitter of IGBT 4 via resistor 11.

Since transistor 8 is off, a base current will flow to transistor 14 via resistor 12 and zener diode 13 but timing of its activation is delayed by the presence of resistor 17. When an ON gate voltage is applied between the gate and emitter of IGBT 4, the latter turns on and its collector-emitter voltage will drop to the level of ON voltage [hereinafter abbreviated as $V_{CE(ON)}$]. Thus, by selecting parts that satisfy the conditions set forth below, transistor 14 can be kept off while IGBT 4 is on:

$$V_{ZDI}+V_{BE}>V_2+V_{CE(ON)}+V_F$$

where $V_{ZDI}$: the threshold value of zener diode 13;
$V_{BE}$: the base-emitter voltage of transistor 14; and
$V_F$: the forward voltage of diode 15.

When photocoupler 5 turns off, transistor 8 turns on, as a result of which transistor 9 turns off and transistor 10 turns on to apply an OFF gate voltage between the gate and emitter of IGBT 4 via resistor 11, thereby turning IGBT 4 off. When transistor 8 turns on, capacitor 16 discharges so that IGBT 4 can be effectively turned on in a subsequent step.

If a shorting accident occurs when IGBT 4 is on its collector-emitter voltage increases until the following relationship is established:

$$V_{ZDI}+V_{BE}>V_2+V_{CE(ON)}+V_F$$

As a result, transistor 14 conducts and an OFF gate voltage is applied between the gate and emitter of IGBT 4, thereby turning it off to cut off the flowing overcurrent.

When the prior art drive circuit shown in FIG. 14 operates to protect the voltage-driven semiconductor device of interest from overcurrent, an OFF gate voltage is applied to the gate of IGBT 4 simultaneously with conduction of transistor 14 and hence, a great decrease in current ($-di/dt$) will occur when the overcurrent is cut off. This involves the potential hazard of an excessive voltage [i.e., the sum of the voltage induced in the wiring inductance ($ls \cdot di/dt$) and the dc circuit voltage] of being exerted on IGBT 4.

Further, the delay circuit composed of capacitor 16 causes time lag in the sensing of overcurrent and an unduly great amount of energy will be consumed by the device in the period from the occurrence of shorting to the interruption of the overcurrent.

A further problem rises with IGBT 4 which has static capacitance between collector C, emitter E and gate G as shown in FIG. 16.

As shown by equivalent circuit in FIG. 17, input capacitance Cies charges and discharges in the switching process. Further, the characteristics of the semiconductor device, when it is in an ON state, depends on the value of voltage with which the input capacitance is charged, so that charging with a predetermined value of voltage is necessary in order to maintain constant device characteristics.

As described above, the load in the gate drive circuit is capacitive and this causes the possibility that the output voltage will not reach a predetermined value of gate voltage on account of the inherent characteristics of transistors 9 and 10 at the output stage. If the gate voltage is low, the ON voltage of IGBT 4 will increase and may potentially cause an increased power loss.

Further, the pulse currents rated for transistors are not very large and are only about twice the dc current rating. Hence, the capacity class of IGBT that can be driven is limited by the ratings of transistors at the output stage. A transistor that is capable of driving all classes of IGBT is bulky and will inevitably increase the size of the drive circuit.

If a shorting accident occurs when IGBT 4 is conducting, the flowing current will increase and at the same time, the device voltage ($V_{CE}$) will also increase markedly, producing a very large change in voltage $dV_{CE}/dt$ as shown in FIG. 18. As FIG. 19 shows, IGBT 4 has a junction capacitance $C_{CG}$ between collector (C) and gate (G) and when $dV_{CE/dt}$ is applied to IGBT 4, $C_{CG}$ produces a displacement current i ($=C_{CG} \cdot dV_{CG}/dt$). This resulting displacement current will flow between the gate and emitter of IGBT 4 as shown in FIG. 19.

In the operation of the prior art drive circuit intended to protect the semiconductor circuit of interest form overcurrent, the charge between the gate and emitter of IGBT 4 is removed via resistor 11 (gate resistance) and transistor 10. Since resistance 11 increases the impedance of the drive circuit seen from the IGBT 4, the displacement current i will not flow into transistor 10 from resistor 11 but rather flow directly into the space between the gate and emitter of IGBT 4.

This charging operation will prevent the gate-emitter voltage of IGBT 4 from charging in synchronism with the voltage developing upstream of resistor 11 (i.e., the voltage on the drive circuit side). As a consequence, there will be no decrease in voltage and the short-circuit current will no longer decrease. If the displacement current disappears in this situation, the gate-emitter voltage of IGBT 4 will decrease markedly, causing an abrupt decrease in the short-circuit current and hence a corresponding increase in the rate of its change ($di/dt$). If this occurs, it becomes impossible to suppress the voltage ($ls \cdot di/dt$) induced in the wiring inductance in the main circuit and an excessive voltage greater than what can be withstood by the device will develop and may potentially destroy the device. Further, the non-decreasing short-circuit current will cause the problem of increased energy consumption by the device. These problems become more pronounced as the capacitance (voltage and current ratings) of the device increases because $C_{CG}$ and hence the displacement current will increase.

Another problem with IGBT 4 is that it takes less than a few microseconds for the device to the turned off from the state where a large current is flowing. This causes an extremely large change of current ($di/dt$) when the device turns off and in the presence of wiring inductance (L), a more voltage than can be withstood by the device might be applied between the collector and emitter of IGBT 4 (or between the drain and source of MOS FET).

SUMMARY OF THE INVENTION

The present invention was made to overcome the above described disadvantages of prior art drive circuits.

According to a first aspect of the present invention, in a common drive output circuit for driving dissimilar switching semiconductor devices having different drive input characteristics by turning on and off dc power supplies to apply a voltage between the drive input terminals through two transistors connected in a Darlington pair, the improvement lies in that the collector circuit of one of the two transistors which is not at the output stage has a diode inserted in series which has such a polarity as to permit passage of the collector current.

In the drive output circuit for power devices, a diode is connected in series to the collector of one of the two Darlington-connected transistors which is at the front stage (i.e., non-output stage) of the Darlington connection. With the same base current being supplied to the front-stage transistor, the compound-transistor as the drive output circuit operates as a single transistor in the range of small collector currents and its collector-emitter current is held at a sufficiently low level to reduce power loss. In the range of large collector currents, the compound-transistor operates as Darlington-connected transistors and is capable of supplying a large drive current to the power device of interest with a small base current being kept supplied to the front-stage transistor.

In a second aspect of the present invention, a gate drive circuit for use with a voltage driven semiconductor device that has a reflux diode connected in series and in opposite direction to the output side, further includes a constant voltage circuit that supplies the gate of the semiconductor device with a voltage that is higher than the threshold voltage of the semiconductor device but which is lower than the voltage applied in a steady state, and a timer that allows the constant voltage circuit to operate, when the semiconductor device is on, for at least the period of time by which the reverse recovery time of the diode lapses.

In a third aspect of the present invention, a gate drive circuit for use with a voltage-driven semiconductor device has a pair of complementary switching elements at the output stage of said drive circuit. Of the two switching elements, one for turning on the semiconductor device has a shorter switching time than the other for turning off the semiconductor device in such a way that when the semiconductor device is on, the two switching elements turn on simultaneously for a certain period of time which is at least longer than the reverse recovery time of the reflux diode. Since the voltage applied to the gate of the semiconductor device during this period is determined by the voltage-dividing ratio of resistors connected in series to the pair of switching elements, the voltage is set at a value higher than the threshold voltage of the semiconductor device but lower than the voltage applied in a steady state.

According to the second aspect of the present invention, when the voltage-driven semiconductor device is to be turned on, a relatively low constant voltage is applied between the gate and emitter of the semiconductor device by the constant voltage circuit for a certain period of time that is determined by the timer (i.e., a time longer than the reverse recovery time of the reflux diode connected to the semiconductor device on the output side). As a result, the output current from the semiconductor device is suppressed to a small value and the rate of change of the reverse recovery current flowing through the reflux diode connected in series at the output side becomes small enough to prevent the development of an overvoltage across the reflux diode and the resulting change in voltage is so small that there will be no possibility of the semiconductor device turning on erroneously or being destroyed or of the drive circuit operating erroneously.

After the lapse of the certain period of time determined by the timer, the application of low voltage to the gate of the semiconductor device by means of the constant voltage circuit stops and a normal value of voltage will develop between the gate and emitter of the device, thus permitting an adequately large output current to be produced from the semiconductor device. Since the reflux diode has already restored its reverse-blocking capability, no deleterious current will flow into this diode.

According to the third aspect of the present invention, a period is provided for which one switching element at the output stage of the gate drive circuit for turning on the semiconductor device and the other switching element for turning off the semiconductor device are turned on simultaneously when the semiconductor device is to be turned on. Further, the gate-to-emitter voltage of the semiconductor device is set at a value higher than the threshold voltage of the semiconductor device but lower than the voltage to be developed in a steady state. If the gate-emitter voltage of the semiconductor device is reduced as described above, the output characteristics of the semiconductor device will allow it to produce a suppressed output current (collector current) and in response to the decrease in the reverse recovery current of the reflux diode connected in series to the semiconductor device, the transient voltage across the reflux diode can be suppressed and the rate of change of voltage is reduced as described in connection with the first aspect of the present invention.

In accordance with the third aspect of the present invention, the duration of time for which the two switching elements turn on simultaneously is made at least substantially equal to the length of the reverse recovery time of the reflux diode. As a result, when this period lapses, only the switching element for turning on the semiconductor device will turn on and the gate-emitter voltage of the semiconductor device will attain the normal level, thus allowing it to produce an adequately large output current.

In a fourth aspect of the present invention, a drive circuit for use with a voltage-driven semiconductor device comprises a drive section having as constituent elements at least a signal insulating photocoupler and a pair of complementary output transistors and a protecting section for protecting the voltage-driven semiconductor device from overcurrent that develops when a shorting accident occurs in the device being driven, the protecting section being composed of detection means that monitors the voltage at the input main terminal of the device in the presence of a drive signal and which produces a detection signal if the voltage exceeds a predetermined level, and a variable voltage source that gradually lowers the voltage with time while the detection means is operating, with a diode being connected between the variable voltage source and the base terminal of each of the output transistors in such a way that the anode is directed to said base terminal.

In a fifth aspect of the present invention, the collector terminal of a transistor which conducts when the detection means senses that the voltage at the input main terminal of the voltage-driven semiconductor device has exceeded a predetermined level is connected to the collector terminal of the signal insulating photocoupler via a diode the forward direction of which is toward the transistor.

In a sixth aspect of the present invention, the pair of complementary output transistors in the drive section consists of an FET as a transistor for turning on the device and a dipolar transistor as a transistor for turning it off.

In a seventh aspect of the present invention, the positive electrode terminal of a capacitor as a component of the variable voltage source in the protecting section is connected to the gate terminal of the voltage-driven semiconductor device via a diode.

In an eighth aspect of the present invention, the drive circuit comprises a drive section having as constituent elements a pair of output transistors consisting of a forward bias applying transistor that applies a forward voltage between the gate and cathode of the voltage-driven semiconductor device to turn it on and a reverse bias applying transistor that applies a reverse voltage between the gate and cathode of the device to turn it off, detection means that monitors the voltage at the input main terminal of the device in the presence of a drive signal and which produces a detection signal if the voltage exceeds a predetermined level, means that inactivates the forward bias applying transistor when the detection signal is produced by the detection means so as to remove the forward voltage applied, and a resistor that becomes effective with at least the applied forward voltage being removed and without any reverse voltage being applied on account of inactivation of the reverse bias applying transistor and which forms a shunt between the gate and cathode of the semiconductor device.

According to the fourth aspect of the present invention, the gate-emitter voltage of the semiconductor device decreases gradually with time after the sensing of the overcurrent. As shown in FIG. 15, the value of short-circuit current $I_{CP}$ flowing through the semiconductor device depends on the voltage $V_{GE}$ applied between the gate and emitter of the device, so that the short-circuit current also decreases in proportion as the gate-emitter voltage decreases. Accordingly, the rate of decrease of current ($-di/dt$) which occurs when the overcurrent is cut off can be suppressed to a small value. Further, the semiconductor device will conduct if the gate-emitter voltage is higher than its threshold level. Therefore, if the time required for the gate-emitter voltage to become equal to the threshold level after the transistor in the overcurrent sensing section has conducted is set to be longer than the time when the semiconductor device turns on, the delay circuit which has been necessary in the prior art drive circuit can be eliminated and the operation for protecting the device from overcurrent can be performed as soon as it occurs, thereby reducing the energy consumption by the device.

According to the fifth aspect of the present invention, the advantage described above is of course attained. In addition, as long as the overcurrent sensing section is operating, gate OFF operation is not effected even if an OFF signal is supplied to the signal insulating photocoupler and instead the operation of the variable voltage source is performed preferentially, thereby insuring that the operation for protecting the device from overcurrent will continue.

According to the sixth aspect of the present invention, an FET is used as a device for turning on the gate drive circuit. Since the output of FET has resistive characteristics, SW1 in FIG. 17 can be regarded as a resistor. As a result, the input capacitance of IGBT charges through the path consisting of power source $V_1$, SW1, resistor ($R_G$) and input capacitance. When the charged voltage exceeds threshold level, IGBT turns on. Since SW1 can be regarded as a resistor, the input capacitance of IGBT is charged up to the predetermined gate voltage supplied by power source $V_1$. Further, the FET, the pulse current rating of which is 4 to 5 times as large as the dc current rating, is less subject to the limitation on the gate drive circuit by the capacity class of IGBT and hence a single FET suffices for operation with a broad class of IGBTs. In order to turn off the gate drive circuit, one only needs to remove the charge from the input capacitance,, and this imposes only a small restriction on the device at the output stage, thus enabling the drive circuit to be turned off by means of a bipolar transistor.

According to the seventh aspect of the present invention, the gate terminal of the semiconductor device having a gate resistance is connected via a diode to the positive electrode terminal of a capacitor as the variable voltage source. Thus, the drive circuit seen from the semiconductor device has a sufficiently low impedance to permit the displacement current developing at a short-circuit fault to flow toward the drive circuit. Further, in proportion as the capacitor voltage is discharged after the occurrence of overcurrent, the gate-emitter voltage of the semiconductor device will decrease to insure that the circuit's capability of protecting the device from overcurrent is effectively exhibited.

According to the eighth aspect of the present invention, the gate-emitter of IGBT (or the gate-source of MOS FET) may be considered to be equivalent to a capacitor and the speed at which the device is turned off will vary with the time required for the charge in the gate-emitter (or gate-source) to be removed from the capacitor. If an accident such as shorting of the load occurs, the collector-emitter (or gate-source) voltage of the device will increase to a level nearly equal to the supply voltage. Thus, according to the fifth aspect of the present invention, a circuit is provided for comparing the potential a the collector of IGBT (or drain of MOS FET) with a reference voltage. If the collector (or drain) voltage is found to be higher than the reference voltage when an ON signal is applied, it is concluded that shorting accident has occurred, and the transistors for applying a forward and a reverse voltage to the device are turned off simultaneously, so that no bias is applied to the gate of IGBT (or MOS FET). As a result, the discharging resistance increases and the charge stored in the gate-emitter of IGBT (or gate-source of MOS FET) will be removed over an prolonged time, thereby allowing the device to turn off at a slow speed. This contributes to interruption of the overcurrent while preventing the application of overvoltage to the device.

BRIEF DESCRIPTION OF THE DRAWINGS

FIG. 11 is a diagram showing in the current and voltage waveforms generated from a diode in the circuit shown in FIG. 9;

FIG. 12 is an equivalent circuit diagram for a shorting accident that occurs in a power converting apparatus using a voltage-driven semiconductor device;

FIG. 13 is a timing chart showing the voltage and current waveforms generated from the semiconductor device;

FIG. 24 is a timing chart showing the waveforms generated from various operating components of the circuit shown in FIG. 23;

DETAILED DESCRIPTION OF THE INVENTION

The preferred embodiments of the present invention will be described below with reference to FIGS. 20-34.

Figure 2:
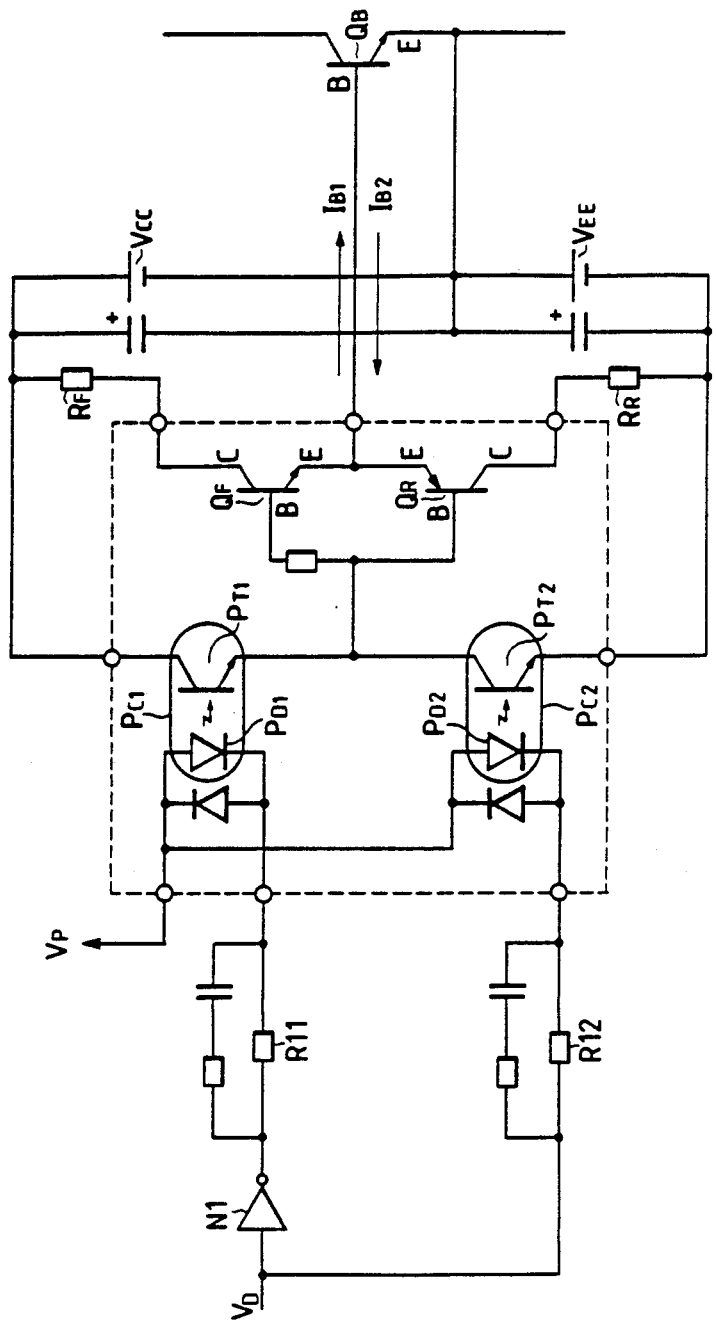
FIG. 2 is a diagram showing an illustrative composition of a circuit for driving a bipolar transistor.
Figure 20:
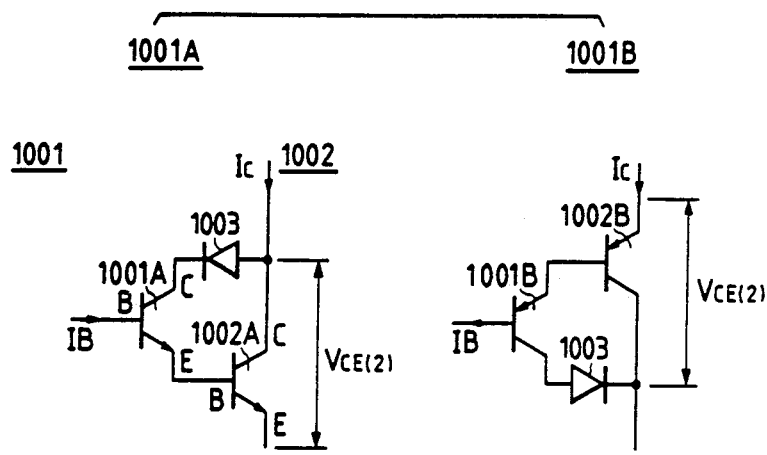
FIG. 20 is a diagram showing the compositions of power device drive output circuits which are a first embodiment of the present invention.
Figure 21:
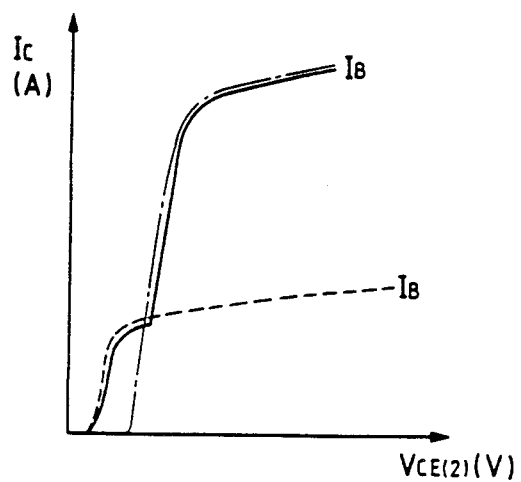
FIG. 21 is a graph showing illustrative output characteristic of the circuits shown in FIG. 20.

FIGS. 20-22 show a first embodiment. FIG. 20 shows the composition of the drive output circuit of the present invention (which corresponds to output stage transistors QF and QR in FIGS. 2 and 3), and FIG. 21 depicts an illustrative characteristic of this drive output circuit.

In FIG. 20, a drive output circuit composed of npn transistors is indicated by 1001A, and one composed of pnp transistors is indicated by 1001B. In drive output circuit 1001A, two upon transistors 1001A and 1002A are connected in a Darlington pair, with diode 1003 being inserted in the forward direction into the collector circuit of transistor 1A at the front stage (non-output stage) of the Darlington pair.

Similarly, in drive output circuit 1001B, two pnp transistors 1001B and 1002B are connected in a Darlington pair, with diode 1003 being also inserted in the forward direction into the collector circuit of transistor 1B at the front stage of the Darlington pair. For the sake of convenience in the following description, transistors 1001A and 1001B at the front stage (non-output stage) are sometimes collectively referred to as the first transistor 1001, and transistor 1002A and 1002B at the rear state (output stage) as the second transistor 1002.

The operation of the drive output circuit of the present invention is described hereinafter, with 1001A being taken as an example. The current IB of drive output circuit 1001A flows through the path consisting of the base B of the first transistor 1001A, its emitter E, the base B of the second transistor 1002A, and the its emitter consisting of the base B of the first transistor 1001A, its collector C, the collector C of the second transistor 2A, and its emitter E. As a result, the collector-emitter voltage VCE(2) of the second transistor 1002A would increase since the potential relationship with the first transistor 1001A would be expressed by:

$$VCE(2) = VBE(2) + VBE(1) - VBC(1) \quad (2)$$

where VBE(2) and VBE(1) are the base-emitter voltages of transistors 1002A and 1001A, respectively, and VBC(1) is the base-collector voltage of transistor 1001A.

In fact, however, the drive output circuit of the present invention has diode 1003 inserted in the manner described above and successfully prevents the establishment of the potential relationship expressed by equation (2). Thus, in the range of low collector currents IC where the first transistor 1001A need not work as a transistor, the drive output circuit 1001A allows only the second transistor 1002A to operate as a single transistor, thereby reducing VCE(2) to a low level. However, in the range of high collector currents IC, the drive output circuit 1001A works as a Darlington pair including the first transistor 1001A. The above description will equally apply to the drive output circuit 1001B.

Operating in the manner described above, drive output circuits 1001A and 1001B provide an output characteristic [i.e., collector current IC vs collector-emitter voltage VCE(2)] a shown in FIG. 21. The output characteristic of the second transistor 1002 is indicated by the dashed curve, and that of the Darlington pair of the first and second transistors 1001A and 1002A is indicated by the one-long-and-one-short dashed line. Given the same level of base current IB, drive output circuits 1001A and 1001B will operate on the curve for whichever the lower level of VCE(2). Thus, the output characteristics of 1001A and 1001 is indicated by the solid line.

Figure 3:
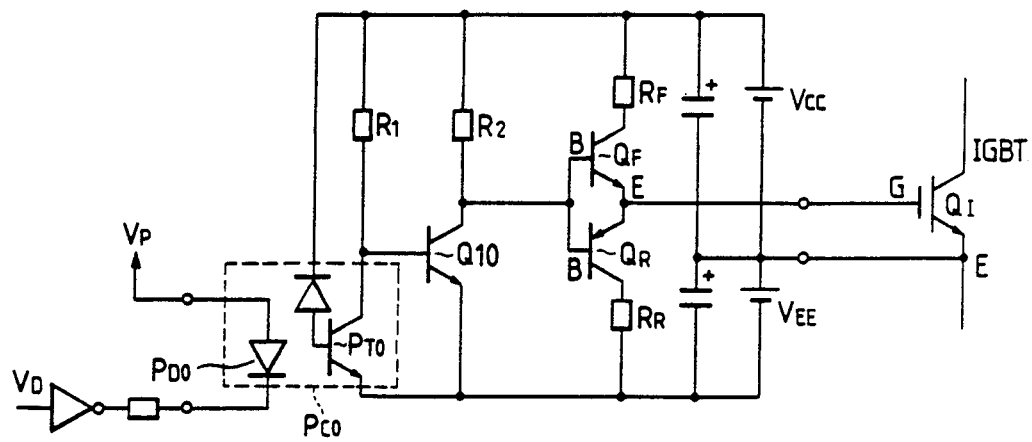
FIG. 3 is a diagram showing an illustrative composition of a circuit for driving an IGBT.
Figure 4A:
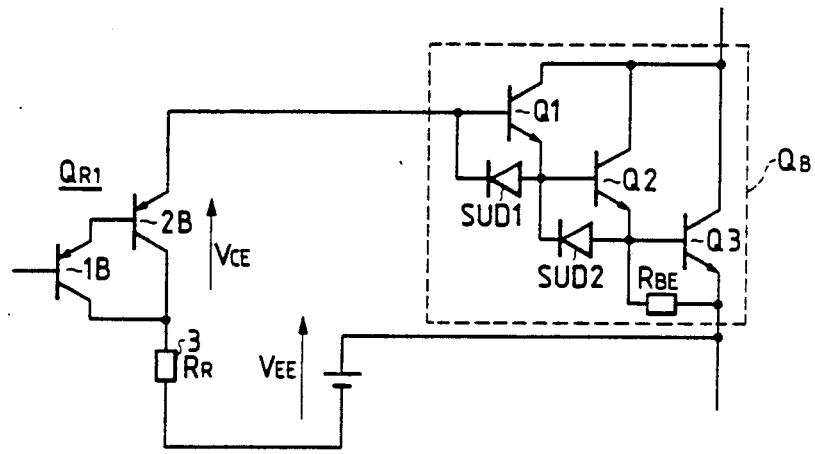
FIGS. 4(A) and 4(b) are an illustration of the reverse bias voltage of a bipolar transistor.
Figure 4B:
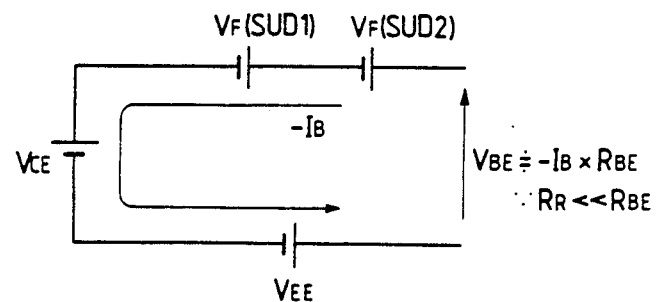
Figure 5:
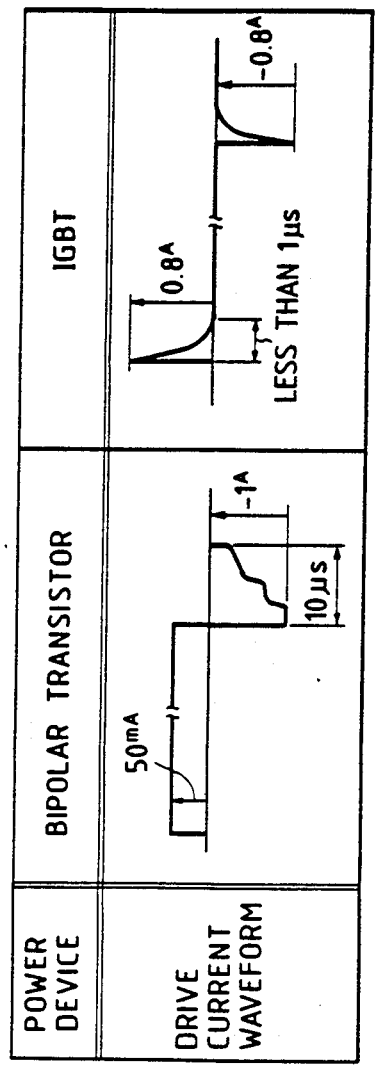
FIG. 5 shows timing charts for drive currents applied to power devices.
Figure 22A:
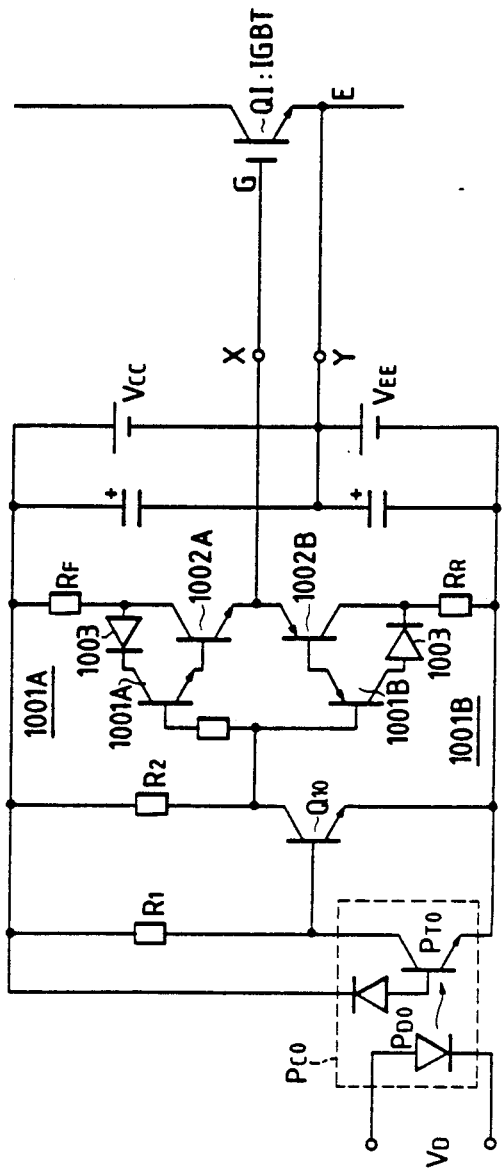
FIGS. 22(A) and 22(B) are diagrams showing an example of the composition of a power device drive circuit using the circuits shown in FIG. 20.
Figure 22B:
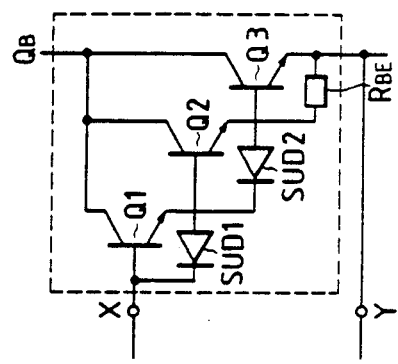

FIGS. 22(A) and 22(B) show the composition of a drive circuit using the drive output circuits 1001A and 1001B of FIG. 20 in place of the drive output stage transistors QF and QR, respectively, shown in FIG. 3. The basic part of this circuit may be used as a common tool for driving a variety of power devices including IGBT QI and bipolar transistor QB.

The drive output circuit of the first embodiment of the present invention for driving power devices comprises a Darlington pair of transistors, with a diode inserted in the forward direction into the collector circuit of the transistor at the front stage of the Darlington pair. Using this drive output circuit, a low-loss drive circuit can be fabricated that is applicable to any type of power devices including not only bipolar transistors and IGBTs but also MOS FETs which have not been discussed hereinabove. Since this low-loss drive circuit can be put inside a single IC package, the present invention offers the added advantage of contributing to the fabrication of even smaller circuits that utilize power devices.

Figure 1A:
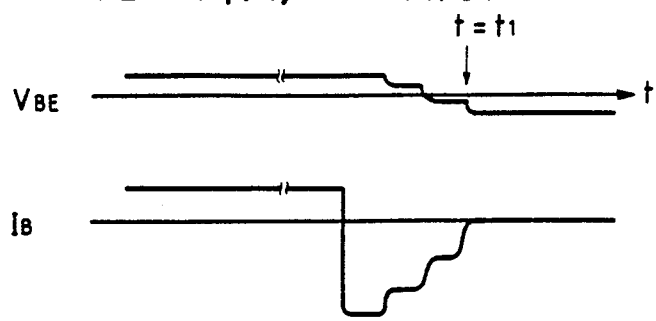
FIG. 1(A) and 1(B) show timing charts for illustrative drive input characteristics of a bipolar transistor and an IGBT.
Figure 1B:
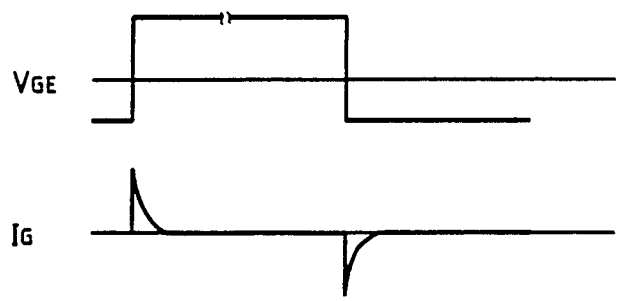
Figure 6:
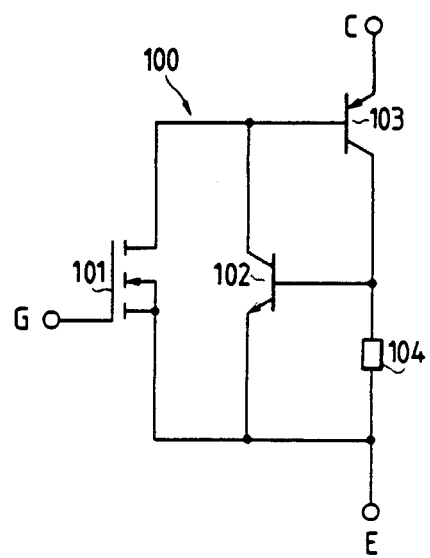
FIG. 6 is a diagram showing an equivalent circuit of IGBT.
Figure 7:
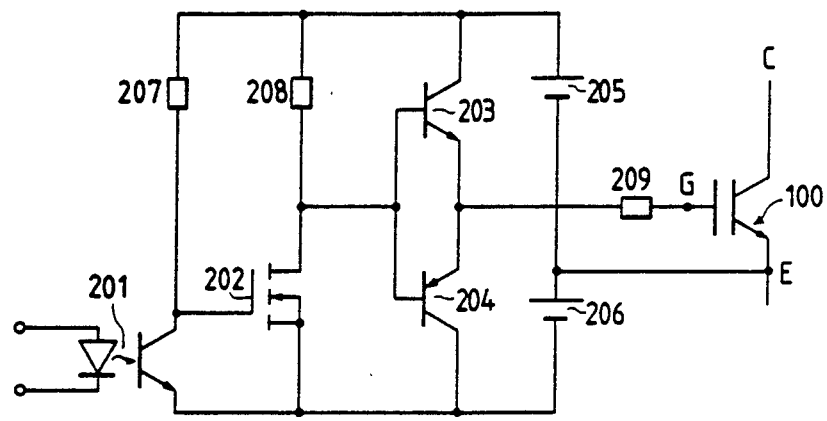
FIG. 7 is a diagram showing an exemplary gate drive circuit.
Figure 23:
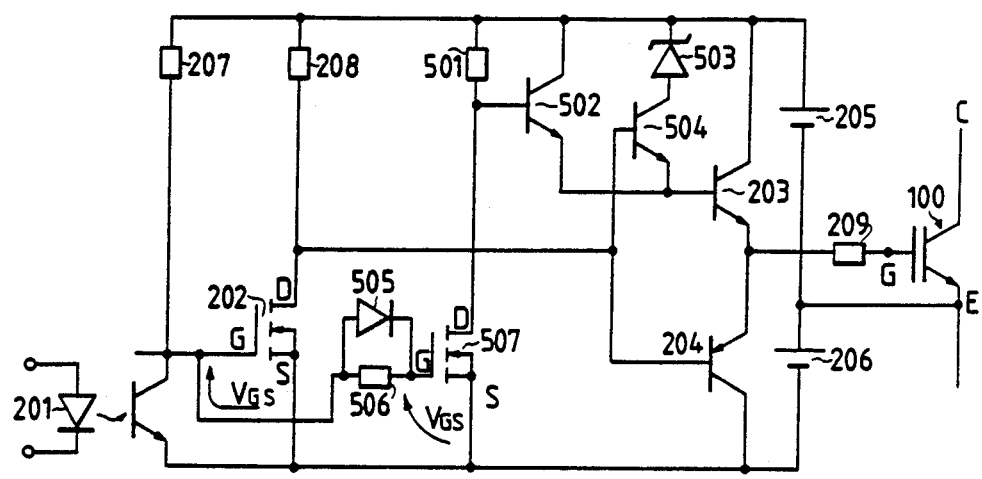
FIG. 23 is a circuit diagram showing a second embodiment of the present invention.

FIG. 23 shows a second embodiment of the present invention, which is a circuit for driving IGBT as a voltage-driven semiconductor device. As in FIGS. 6–8, the circuit comprises IGBT 100, photocoupler 201, N channel MOS FET 202, NPN transistor 203, PNP transistor 204, forward bias supply source 205, reverse bias supply source 206, forward bias supply source 205, reverse bias supply source 206, and resistors 207–209.

The drive circuit shown in FIG. 23 further includes a circuit that operates transistor 203 at the output stage as a constant voltage source, and a timer that allows said circuit to work for a predetermined period of time. Stated more specifically, the circuit for operating transistor 203 as a constant voltage source is composed of an NPN transistor 504 the base of which is connected to the base of transistor 204 at the output stage and the emitter of which is connected to the base of transistor 203, a constant voltage diode 503 the anode of which is connected to the collector of NPN transistor 504 and the cathode of which is connected to the positive electrode of forward bias supply source 205, and resistor 208 already mentioned above. The timer is composed of resistor 501 connected between the positive electrode of forward bias supply 205 and the drain of N channel MOS FET 507 which is to be described hereinafter, NPN transistor 502 the collector and base of which are connected to opposite ends of the resistor 501 and the emitter of which is connected to the emitter of transistor 504, FET 507 the drain of which is connected to one end of resistor 501 and the source of which is connected to the negative electrode of reverse bias supply source 206, resistor 506 connected between the gate of FET 507 and the gate of FET 202, and diode 505 connected in parallel to resistor 506, with its cathode being directed to the gate of FET 507.

In the circuit shown in FIG. 23, transistor 502 works in such a way that when it turns on, it shorts the series circuit composed of constant voltage diode 503 and transistor 504, whereas the timer works in such a way that FET 202 will turn off at a slightly different time than FET 507 turns off on account of the resistor 506, as well as the gate input capacitance and gate threshold level of FET 507. Diode 505 serves to allow both FETs 202 and 507 to turn on at the same time.

The operation of the circuit shown in FIG. 23 is now described with reference to FIG. 24. When an associated control circuit (not shown) is activated to have a current flow to the primary side of photocoupler 201, thereby turning it on at time $T_1$, FET 202 is first turned off at time $T_2$. When FET 202 turns off, a current flows to the base of transistor 504 through forward bias supply source 205 and resistor 208, whereupon transistor 504 turns on to have the voltage $V_{ZD}$ of constant voltage diOde 503 develop between the collector and base of transistor 203. This voltage permits transistor 203 to function as a constant voltage source and its collector-emitter voltage $V_{CE}$ is equal to:

$$V_{CE} = V_{BE} + V_{ZD} + V_{CE} \simeq V_{ZD} = V_1 \qquad (3)$$

where $V_{BE}$ is the base-emitter voltage of transistor 203 and $V_{CE}$, is the collector-emitter voltage of transistor 4. From equation (3), the gate-emitter voltage $V_{GE}$ of IGBT 100 is expressed by:

$$V_{GE} = Vcc - V_1 \simeq Vcc = V_{ZD} \qquad (2)$$

Where Vcc is the voltage applied from forward bias supply source 205. In other words, $V_{GE}$ is smaller than Vcc by $V_{ZD}$.

When FET 507 is off, transistor 502 turns on and the circuit composed of constant voltage diode 503 connected in series with transistor 504 is shorted. Therefore, as long as voltage $V_{ZD}(V_1)$ is generated, FET 507 remains on as shown in FIG. 24. After photocoupler 201 turns on, the gate-source voltage $V_{GS}$ of FET 507 is discharged via resistor 506 until the value of $V_{GS}$ becomes lower than the threshold level at time $T_3$, when FET 507 turns off. In other words, FET 507 turns off a certain time after FET 202 by the already-described action of the timer. When FET 507 turns off, a base current flows into transistor 502 to turn on. As a result, the circuit composed of constant voltage diode 503 connected in series with transistor 504 is shorted and $V_1$ becomes nearly equal to zero. Thus, the value of $V_{GE}$ is equal to the forward bias voltage Vcc from power supply 205.

According to the embodiment described above, the gate-emitter voltage $V_{GE}$ of IGBT 100 is held at a constant voltage $Vcc - V_1$ lower than the supply voltage Vcc for the period T from time $T_2$ to $T_3$ which is predetermined by the timer. It should also be noted that the period T must be set to be longer than the reverse recover time of the reflux diode (not shown) connected in series and in opposite direction to IGBT 100 at the output side. Needless to say, voltage $Vcc - V_1$ is higher than the threshold level of IGBT 100.

Figure 25:
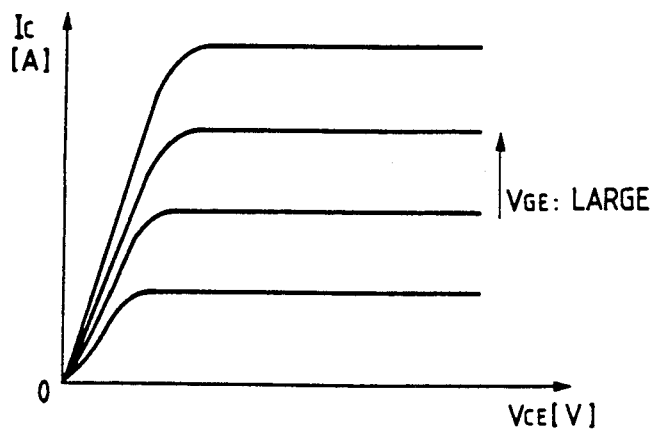
FIG. 25 is a graph showing the output characteristics of an IGBT.

As described above, the gate emitter voltage $V_{GE}$ of IGBT 100 iS held at a cOmparative low level when it is turned on, and this enables the collector current IC of IGBT 100 to be suppressed at a low level as shown by the IGBT output characteristics curve in FIG. 25. Hence, the reverse recovery current through the reflux diode connected in series to IGBT 100 can be suppressed to reduce the rate of change of current dI/dt, with consequent reduction both in the voltage $V_D$ across the reflux diode and in the rate of change of voltage dV/dt.

Further, as is clear from FIG. 25, the voltage at which IGBT 100 is turned on increases with decreasing voltage $V_{GE}$. However, in the embodiment described above, $V_{GE}$ held low only for the period T of the time during which IGBT 100 is turned on and in the steady state subsequent to the lapse of this period T, the voltage for turning on IGBT 100 can be reduced to an adequately low level.

Figure 8:
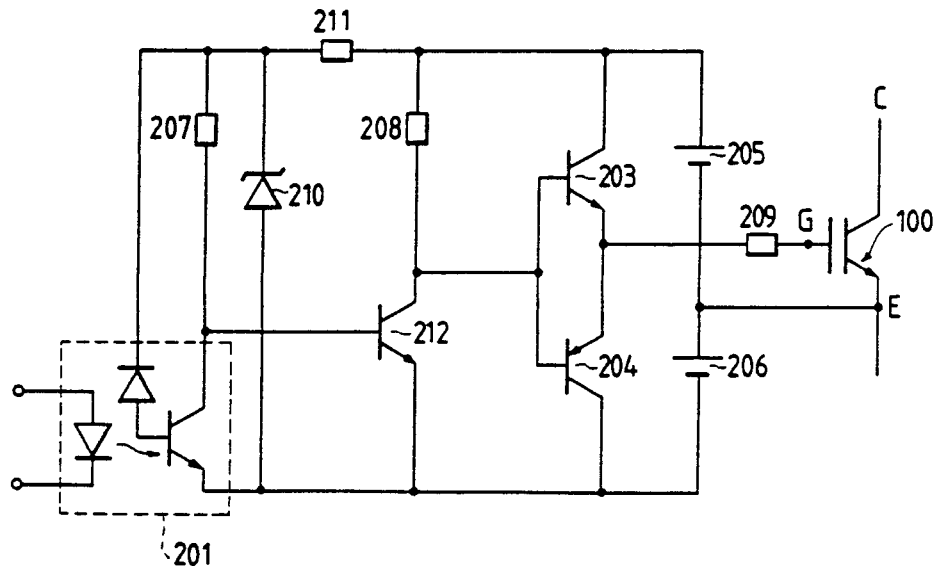
FIG. 8 is a diagram showing another exemplary gate drive circuit.
Figure 9:
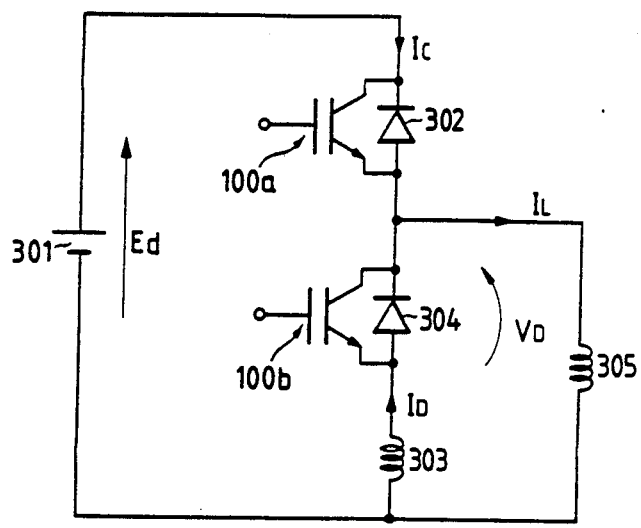
FIG. 9 is a circuit diagram of a chopper using an IGBT.
Figure 10:
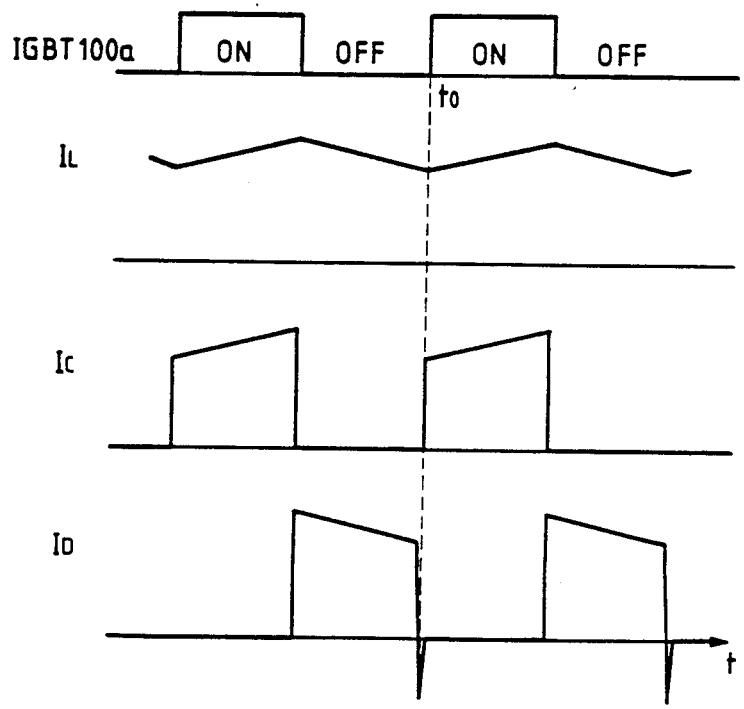
FIG. 10 is a timing chart showing the waveforms generated from various operating components of the circuit shown in FIG. 9.
Figure 26:
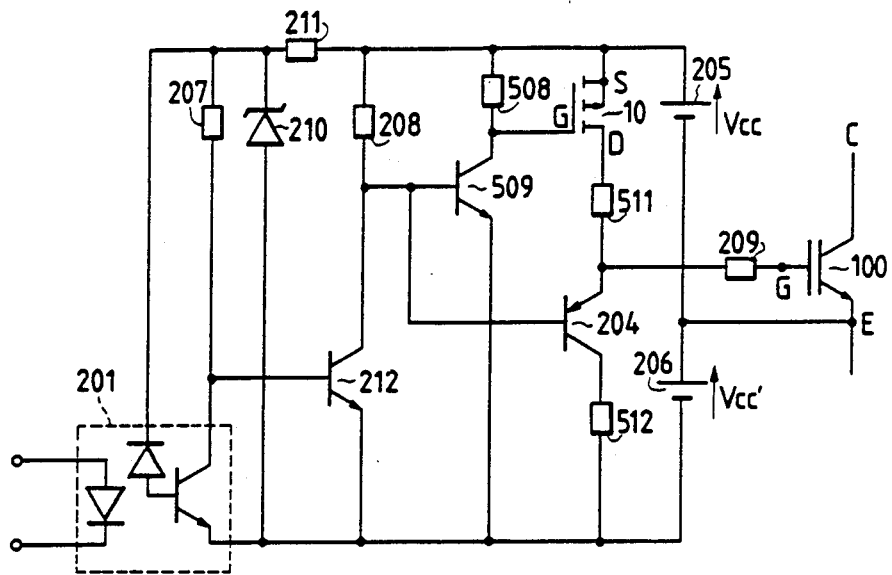
FIG. 26 is a circuit diagram showing a third embodiment of the present invention.

FIG. 26 shows a third embodiment of the present invention. In FIG. 26, the components which are the same as those shown in FIG. 23 or 8 are identified by like numerals and will not be described in detail. Therefore, the following description is chiefly directed to the aspects which differ from those shown in these two figures. What is unique about the embodiment shown in FIG. 26 is that a P channel MOS FET 510 is used as a switching element for turning IGBT 100 on, with the source of FET 510 being connected to the positive electrode of the forward bias supply source 205 and its drain connected to the emitter of transistor 204 via resistor 511. The collector of transistor 204 is connected to the negative electrode of reverse bias supply source 206 via resistor 512.

The collector of transistor 212 is connected to the bases of transistors 509 and 204, and the collector of transistor 509 is connected to the positive electrode of forward bias supply source 205 via resistor 508. The collector of transistor 509 is connected to the gate of FET 510.

The operation of the gate drive circuit shown in FIG. 26 is described hereinafter starting with the operation by which IGBT 100 is turned on. First, photocoupler 201 is turned on, causing transistor 212 to turn off and transistor 509 to turn on. When transistor 509 turns on, the gate of FET 510 is connected to the negative electrode of reverse bias supply source 206 and a forward bias voltage is applied between the gate and source of FET 510 to turn it on. When photocoupler 201 turns on, transistor 204 also turns off. But since FETs generally have shorter switching times than transistors, FET 510 turns on before transistor 204 turns off. As a result, both FET 510 and transistor 204 will remain on until the latter turns off.

During the time when FET 510 and transistor 204 are turned on simultaneously, the gate-emitter voltage $V_{GE}$ of IGBT 100 will be:

$$VGE = \frac{R_{12}}{R_{11} + R_{12}} (Vcc + Vcc') - Vcc' \qquad (5)$$

where Vcc' is the voltage applied from reverse bias supply source 206.

From equation (5), one can see that the gate-emitter voltage $V_{GE}$ of IGBT 100 can be suppressed to a level lower than forward bias voltage Vcc from power supply 205. As is clear from FIG. 25, this leads to a decrease in the collector current Ic of IGBT 100 and consequent elimination of the increase in the rates of change of current and voltage which would otherwise occur if an increased reverse recovery current flowed through the reflux diode.

The operation by which IGBT 100 is turned off will be now described. When photocoupler 201 turns off, transistor 212 will turn on. As a result, transistor 509 turns off and the gate potential or FET 510 becomes equal to its source potential, thereby allowing FET 510 to turn off. When transistor 212 turns on, transistor 204 also turn on. However, FET 510 turns off before transistor 204 turns on, so that there will be no period during which both FET 510 and transistor 204 remain on as in the case where IGBT 100 is turned on. Instead, transistor 204 performs an on-operation in the same manner as in the prior art.

While the foregoing description of the embodiments of the present invention is directed to a circuit for driving IGBT, it should be understood that the concept of the present invention is also applicable to other voltage-driven semiconductor devices such as power MOS FETs.

According to the second embodiment of the present invention, when a voltage-driven semiconductor device is turned on, the gate of that semiconductor device is supplied with a comparatively low voltage for a certain period of time predetermined with a timer. According to the third embodiment of the present invention, a pair of switching elements having different switching times are provided at the output stage of a gate drive circuit and when the semiconductor device is turned on, the two switching elements are allowed to remain simultaneously on for a predetermined period of time, during which time the gate of that semiconductor device is supplied with a comparatively low voltage. As a result, the output current from the semiconductor device is sufficiently suppressed to reduce the reverse recovery current flowing through the reflux diode, thereby preventing the occurrence of overvoltage and reducing the rate of change of voltage. This is effective in preventing not only the destruction of the semiconductor device but also the erroneous operation of the drive circuit and the associated control circuit, thus contributing to an improvement in the device reliability.

In addition, the gate drive circuit of the present invention can be fabricated without requiring any substantial change in the design of prior art circuits but by merely adding a few elements thereto. Thus, it offers the advantage of being fabricated at low cost.

Figure 14:
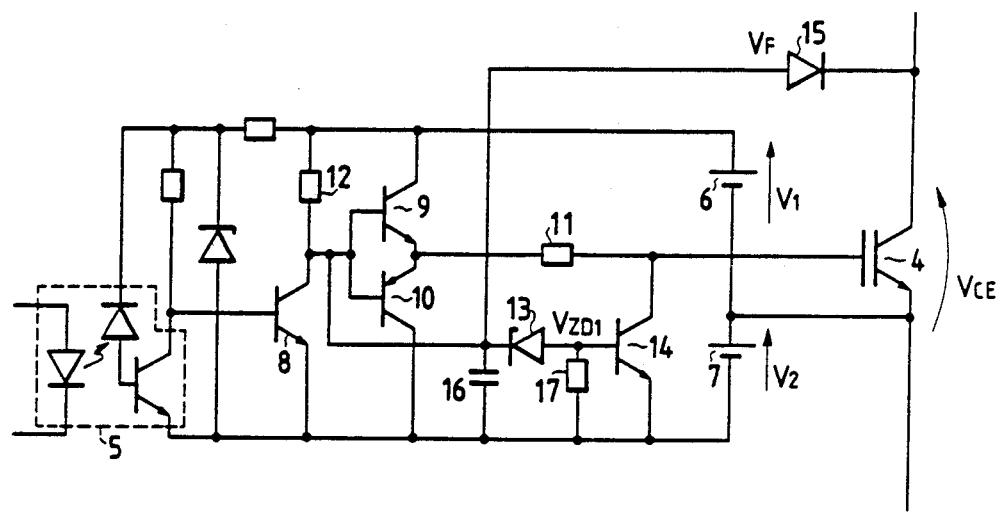
FIG. 14 is a circuit diagram showing a prior art drive circuits.
Figure 15:
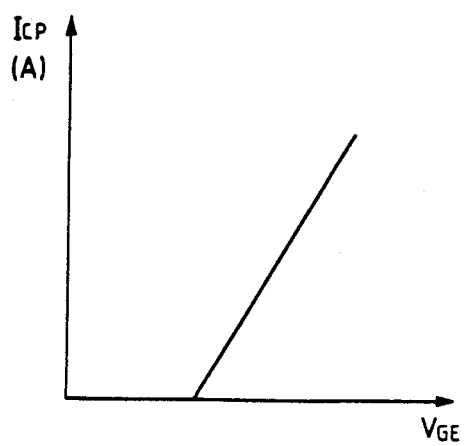
FIG. 15 is a graph showing a short-circuit current vs the gate-emitter voltage of the semiconductor device.
Figure 16:
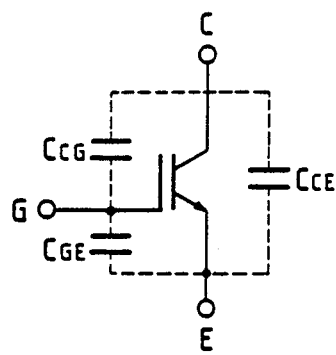
FIG. 16 is a capacitive equivalent circuit diagram of IGBT.
Figure 18:
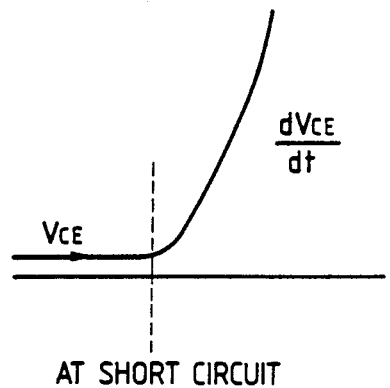
FIG. 18 a graph showing the voltage waveform generated when shorting occurs.
Figure 17:
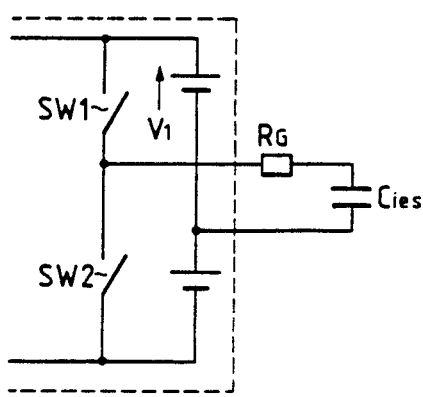
FIG. 17 is an equivalent circuit diagram for the switching process.
Figure 19:
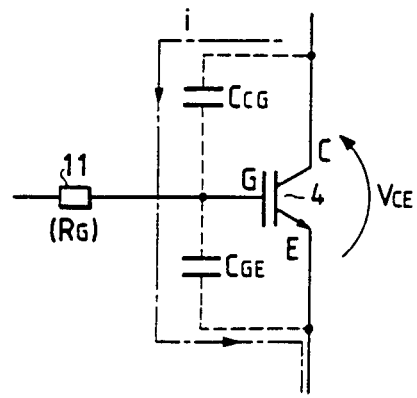
FIG. 19 is a diagram showing the state of a shorted semiconductor device.
Figure 27:
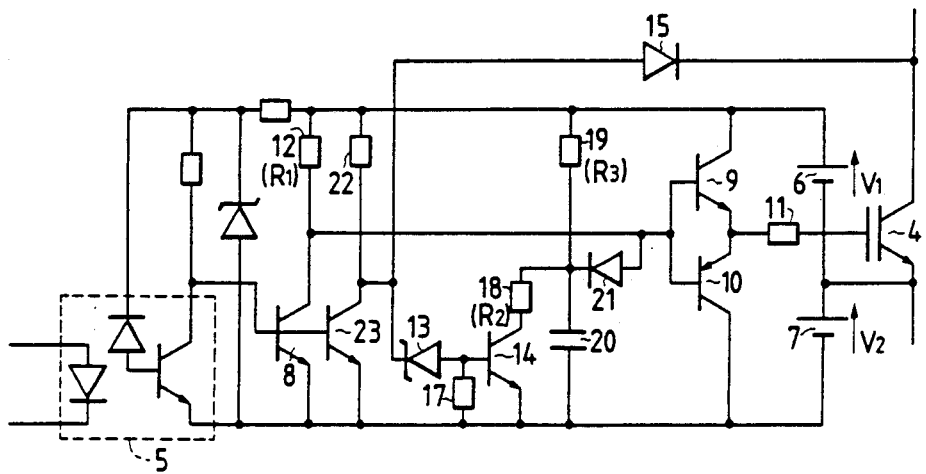
FIG. 27 is a circuit diagram showing a fourth embodiment of the circuit of the present invention for driving a voltage-driven semiconductor device.

FIG. 27 is a circuit diagram showing a fourth embodiment of the circuit for driving a voltage-driven semiconductor device according to the present invention. In FIG. 27, the components which are the same as those shown in FIG. 14 (prior art) are identified by like numerals. As in the prior art, the section for driving IGBT 4 which serves as the main switching element is composed of signal insulating photocoupler 5, a pair of complementary transistors 9 and 10 which are connected to photocoupler 5 via transistor 8, ON gate voltage supply source 6 connected in series to transistor 9, OFF gate voltage supply source 7 connected in series to transistor 10, and resistor 11.

In accordance with the present invention, the overcurrent sensing section in the prior art circuit which is composed of diode 15, zener diode 13, resistor 17 and transistor 14, which monitors the voltage at the collector terminal of IGBT 4, and which produces a detection signal if said voltage exceeds a predetermined level is connected to a voltage limiting circuit in the form of a variable power source connected to the bases of transistors 9 and 10 at the output stage of the drive section and which is composed of resistor 18 and a capacitor 20.

Capacitor 20 is connected to the positive terminal of voltage source 6 via resistor 19 and the junction between capacitor 20 and resistor 19 is connected to the bases of transistors 9 and 10 at the output stage via a diode 21, the anode of which is directed toward transistors 9 and 10.

The base of transistor 8 is connected to the base of transistor 23, the collector of which is connected both to the junction between zener diode 13 and diode 15 in the overcurrent sensing section and to the positive terminal of voltage source 6 via resistor 22, with the emitter of transistor 24 being connected to the negative terminal of voltage source 7, thereby forming a circuit that senses that IGBT 4 is in the ON period and which transmits this information to the overcurrent detecting section.

The operation of the circuit shown in FIG. 27 will proceed as follows. Capacitor 20 is first charged from voltage sources 6 and 7 via resistor 19 until the voltage across capacitor 20 becomes equal to $V_1+V_2$. As shown, diode 21 is connected between the positive terminal of capacitor 20 and the bases of transistors 9 and 10 in such a way that the anode is directed toward the base terminals of the transistors, so that substantially no effects will be exerted on the normal operation of the drive circuit.

As in the prior art, transistor 14 conducts when an overcurrent is sensed and as a result, the charge in capacitor 20 is removed via resistor 18. Then, the differential voltage between $V_2$ and the voltage across capacitor 20 is produced as an output via diode 21 and transistor 9.

If resistors 12, 18 and 19 have respective resistances $R_1$, $R_2$ and $R_3$, $V_{GE}$ can be held at a sufficiently low level to turn IGBT 4 off by selecting these values of resistance in such a way as to satisfy the condition $R_1$, $R_3 > R_2$.

Transistor 23 informs the overcurrent sensing section of the fact that IGBT 4 is in the ON period. It should be noted here that resistor 18 may be replaced by a constant current diode.

In spite of the advantages described above, the drive circuit shown in FIG. 27 has the following problem in actual applications. When the overcurrent sensing section detects an overcurrent, transistor 14 conducts and the gate-emitter voltage of IGBT 4 decreases. However, if an OFF signal is received on this occasion, the circuit will perform the normal OFF operation. As a result, the short-circuit current will be cut off before it is adequately reduced, and the rate of decrease of current ($-di/dt$) will increase during the interruption of the overcurrent. This may produce an excessive voltage that is exerted on the device.

Figure 28:
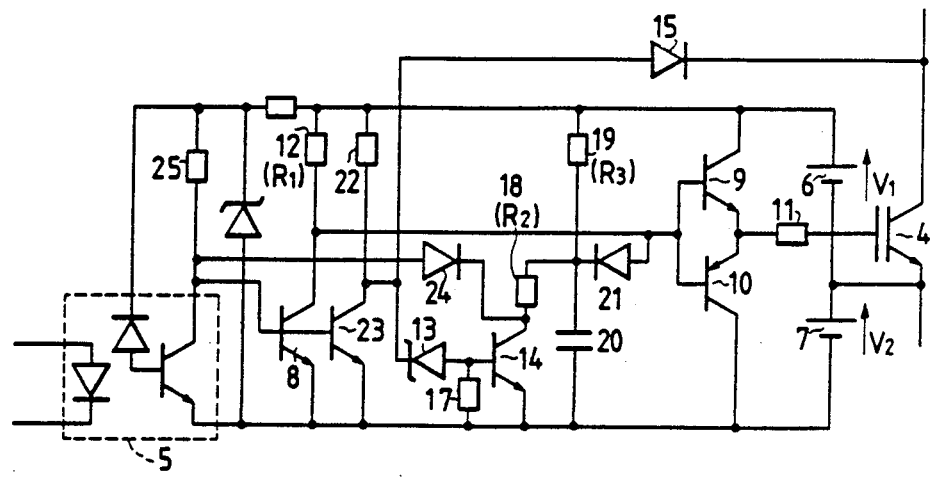
FIG. 28 is a circuit diagram showing a fifth embodiment of the present invention.

The fifth embodiment shown in FIG. 28 is designed to have a capability of coping with the problem described above. To this end, the collector terminal of signal insulating photocoupler 5 is connected to transistor 14 via a diode 24.

The circuit shown in FIG. 28 is similar to the circuit shown in FIG. 27 in that transistor 14 conducts when the overcurrent detecting section senses an over-current fault. When an OFF signal is received on this occasion, photocoupler 5 turns off. Therefore, if parts are selected in such a way that the base-emitter voltage $V_{BE}$ of transistor 8 or 23, the collector-emitter voltage $V_{CE}$ of transistor 14 and the forward voltage $V_F$ of diode 24 satisfy the relationship $V_B >> V_{CE}+V_F$, the current supplied from the voltage sources 6 and 7 via resistor 25 will not flow to the bases of transistors 8 and 23 but flow into transistor 14 via diode 24. As a result, transistors 8 and 23 will not turn off and the circuit will perform the intended operation for protecting the semiconductor device from overcurrent.

During normal OFF operation, transistor 14 will not conduct and there will be not adverse effects resulting from the flowing of current to the bases of transistors 8 and 23.

Figure 29:
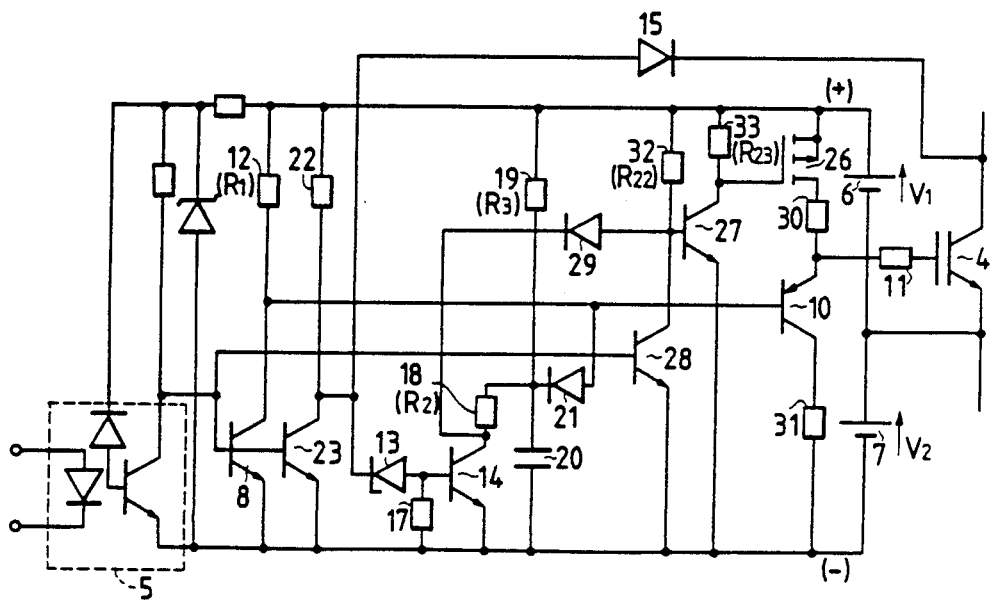
FIG. 29 is a circuit diagram showing a sixth embodiment of the present invention.
Figure 30:
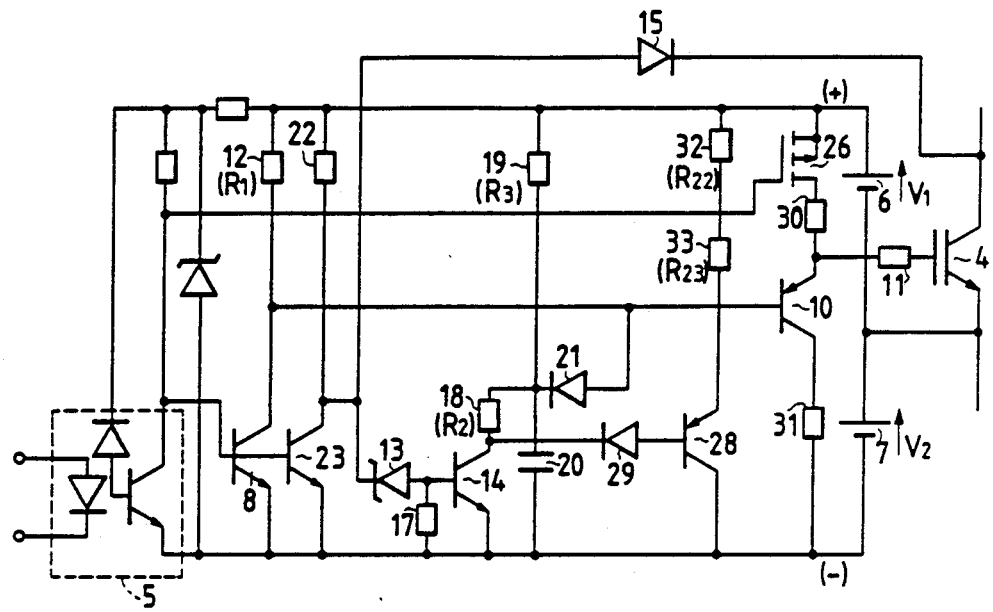
FIG. 30 is a circuit diagram showing a seventh embodiment of the present invention.

FIGS. 29 and 30 show the sixth and seventh embodiments of the present invention, respectively. In the fourth and fifth embodiments described above, the pair of complementary transistors 9 and 10 at the output stage of the drive section consist of bipolar transistors. In the sixth embodiment shown in FIG. 29, transistor 9 for turning on the semiconductor device is replaced by FET 26. As in the fourth and fifth embodiments, transistor 10 for turning off the semiconductor device is a bipolar transistor, but in order to turn FET 26 on and off, two additional transistors 27 and 28 are inserted into the circuit shown in FIG. 29, together with diode 29, and resistors 30, 31, 32 and 33.

Resistor 30 is inserted at the drain of FET 26 and resistor 31 is inserted at the collector of transistor 10. The base of transistor 28 is connected to photocoupler 5 and the base of transistor 27 is connected to the collector of transistor 14 via diode 29. Resistor 32 is inserted at the collector of transistor 28 and resistor 33 is inserted at the collector of transistor 27.

The drive circuit shown in FIG. 29 is turned on and off in the following manner. When a current flows to the primary side of photocoupler 5, it turns on and transistor 28 turns off. When transistor 28 turns off, transistor 27 turns on and the gate-source of FET 26 is forward biased to turn it on.

When FET 26 turns on, forward bias supply source 6 applies a forward bias between the gate and emitter of IGBT 4 via resistor 11, thereby turning IGBT 4 on. As in the prior art, transistor 10 turns off when photocoupler 5 turns on.

IGBT 4 is turned off by reversing the operation described above for turning it on. When the current flowing to the primary side of photocoupler 5 is cut off, it turns off. When photocoupler 5 turns off, transistor 28 turns on. When transistor 28 turns on, transistor 27 turns off, whereupon FET 26 turns off. As in the fourth embodiment, transistor 10 turns on when photocoupler 5 turns off, and reverse bias supply source 7 applied a reverse bias to IGBT 4 via resistor 11, thereby turning IGBT 4 off.

The circuit shown in FIG. 29 will operate in the following way to protect the semiconductor device from overcurrent. When an overcurrent fault is sensed by the same method as described in connection with the fourth embodiment, transistor 14 will turn on. If parts are selected in such a way as to satisfy the condition:

$$V_{BE} >> V_2 + V_{CE} + V_F$$

(where $V_{BE}$ is the base-emitter voltage of transistor 27; $V_{CE}$ is the collector-emitter voltage of transistor 14; $V_F$ is the forward voltage applied to diode 29), the base current of transistor 27 supplied from the power source via resistor 32 will not flow into transistor 27 but flow into transistor 14 via diode 29. As a result, transistor 27 turns off and so does FET 26. Subsequently, transistor 10 turns on and the circuit performs the intended protecting operation as in the fourth embodiment.

The seventh embodiment shown in FIG. 30 is a modification of the sixth embodiment. In this embodiment, FET 26 is turned on and off by means of photocoupler 5 and in order to turn FET 26 off when an overcurrent fault occurs, the combination of transistor 28 with resistors 32 and 33 is employed. Stated more specifically, the gate of FET 26 is connected to photocoupler 5, as well as to the emitter of transistor 28 via resistor 33. The base of transistor 28 is connected to the collector of transistor 14 via diode 29.

FET 26 in the circuit shown in FIG. 30 is turned on and off in the following manner. When photocoupler 5 turns on, the gate (G) of FET 26 is connected to the negative electrode terminal (−) via the secondary side of photocoupler 5, whereupon a forward bias is applied between the gate and source of FET 26 to turn it on. When photocoupler 5 turns off, the gate (G) of FET 26 is connected to the positive electrode terminal (+) via resistor 32 and attains the same potential as the source (S), whereupon FET 26 is turned off.

The circuit shown in FIG. 30 operates in the following manner to protect the semiconductor device from overcurrent. When transistor 14 turns on upon sensing of an overcurrent fault, transistor 28 also turns on. When transistor 28 turns on, the potential at the gate (G) of FET 26 becomes:

$$\frac{R_{23}}{R_{22} + R_{23}} \cdot (V1 + V2).$$

where
$R_{22}$: the potential of resistor 32;
$V_1$: the potential of voltage source 6; and
$V_2$: the potential of voltage source 7.

If parts are selected in such way that $R_{22} < < R_{23}$, the gate potential becomes equal to $V_1 + V_2$, which is the same as the source potential (or below the threshold level at which FET 26 turns off), and FET 26 turns off. In the subsequent period of ordinary protecting operation will proceed.

In both the sixth and seventh embodiments, resistors 30 and 31 are included in order to suppress the short-circuit current which will flow on account of the difference between the time when FET 26 turns on and the time when transistor 10 turns off.

Figure 31:
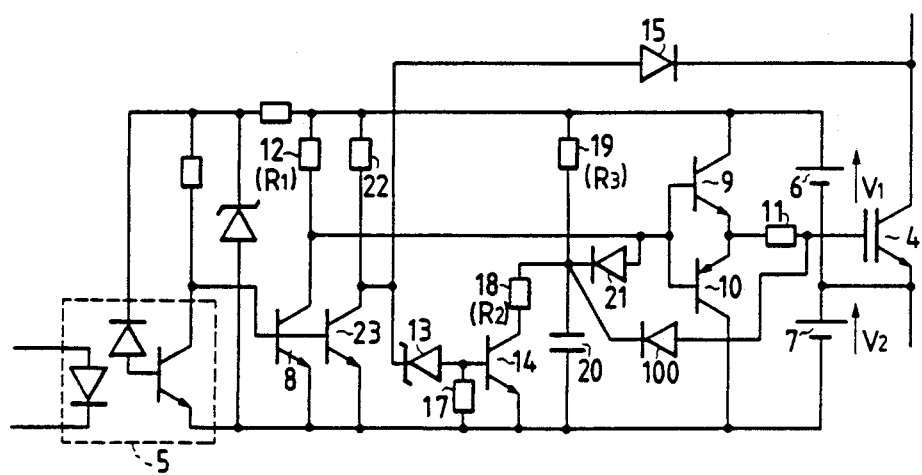
FIG. 31 is a circuit diagram showing an eighth embodiment of the prevent invention.

FIG. 31 shows the eighth embodiment of the present invention, which differs from the fourth embodiment in that diode 100 is added to the circuit shown in FIG. 27. Diode 100 is connected both to the side of gate resistor 11 which is connected to IGBT 4 and to the positive electrode side of capacitor 20 which is a component of the variable power source in the voltage limiting circuit.

When an overcurrent fault is sensed, transistor 14 conducts and the voltage of capacitor 20 is discharged via resistor 18 and transistor 14. In the eighth embodiment of the present invention, diode 100 conducts simultaneously with a drop in the voltage of capacitor 20, causing the gate-emitter voltage of IGBT 4 to decrease. Further, the displacement current due to the discharging of capacitor 20 flows toward the drive circuit through diode 100, thereby preventing the charging of the gate-emitter voltage of IGBT 4. As a consequence, the circuit operates in a reliable manner to protect the semiconductor device from overcurrent.

A further advantage of the circuit shown in FIG. 31 is that unless transistor 14 turns on, the voltage of capacitor 20 remains equal to the sum of the two supply voltages $V_1$ and $V_2$, thus insuring that the forward bias voltage will not be discharged via diode 100 when IGBT 4 is in the ON state.

Figure 32:
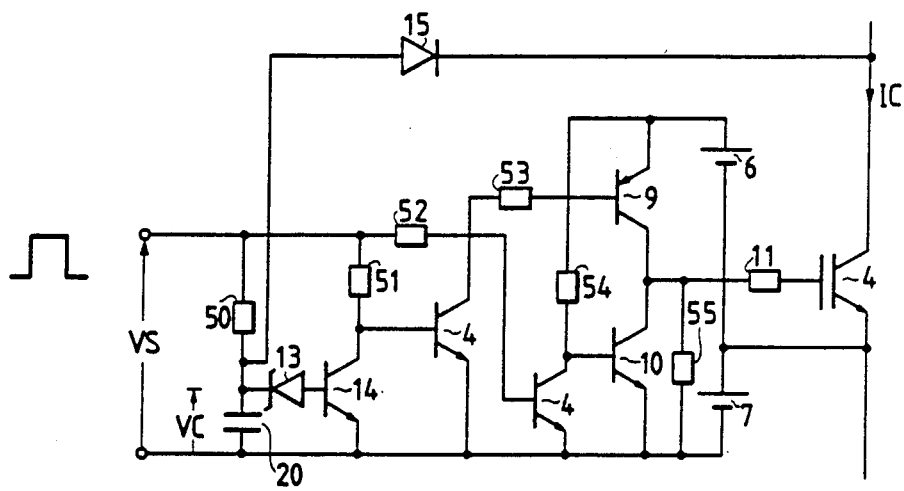
FIG. 32 is a circuit diagram showing a ninth embodiment of the present invention.

FIG. 32 shows the ninth embodiment of the present invention. Symbol VS in FIG. 32 denotes a command signal in response to which IGBT 4 is turned on or off (the signal is hereunder referred to as an ON-OFF command signal). As in the already-described fourth to eighth embodiments, the circuit shown in FIG. 32 includes ON gate voltage supply source 6 for applying a forward bias between the gate and emitter of IGBT 4 via forward bias applying transistor 9, OFF gate voltage supply source 7 for applying a reverse bias between the gate and emitter of IGBT 4 via reverse bias applying transistor 10, and transistor 14 for controlling the sensing of an over-current fault (this transistor is hereunder referred to as an overcurrent detecting transistor). The circuit additionally includes front-stage transistors 45 and 44 for controlling the bases of forward- and reverse-bias applying transistors 9 and 10, respectively.

What is unique about the circuit shown in FIG. 32 is that it includes: means that monitors the anode-cathode voltage of IGBT 4 in an ON state to see if it has exceeded a predetermined level (e.g. the sum of the zener voltage of zener diode 13 and the base-emitter voltage of overcurrent detecting transistor 14) and which inactivates forward bias applying transistor 9 when said anode-cathode voltage is found to have exceeded the predetermined level, thus removing the forward voltage applied (examples of such means include resistors 50, 51, 53, capacitor 20, zener diode 13, and transistors 45 and 14); and a resistor 55 which becomes effective with at least the applied forward voltage being removed and without any reverse voltage being applied on account of inactivation of the reverse bias voltage applying transistor 10 and which forms a shunt between the gate and cathode of IGBT 4.

The circuit shown in FIG. 32 will operate as follows in the normal state. When ON-OFF command signal VS becomes high "H", front-stage transistors 44 and 45 are supplied with a base current via resistors 52 and 51 to turn on. When transistors 44 and 45 turn on, forward bias applying transistor 9 will also turn on since it receives a base current that is supplied from voltage sources 6 and 7 via resistor 53 and transistor 45. On the other hand, reverse bias applying transistor 10 will turn off. Hence, ON gate voltage supplying source 6 applies a sufficient voltage between the gate and emitter of IGBT 4 via resistor 11 to turn it on.

When VS is "H", a charging current flows into capacitor 20 via resistor 50 and its terminal voltage VC will increase gradually. But in the meantime, diode 15 turns on and the terminal voltage VC of the capacitor is clamped at the level equal to the sum of the voltage from OFF gate voltage supply source 7 and the drop in forward voltage that occurs in IGBT 4 and diode 15. However, zener diode 13 will not conduct by the capacitor terminal voltage VC in this state and overcurrent detecting transistor 14 remains off.

When ON-OFF command signal VS becomes low "L", front-stage transistors 44 and 45 turn off, causing forward bias applying transistor 9 to turn off. On the other hand, reverse bias applying transistor 10 will turn on since it receives the base current flowing from voltage sources 6 and 7 via resistor 54. Hence, reverse bias applying voltage source 7 applies the necessary voltage between the gate and emitter of IGBT 4 via resistor 11 and IGBT 4 will turn off rapidly (say, in approximately 1 μs).

When VS is "L", the charge in capacitor 20 is removed via resistor 50 toward the power supply side of ON-OFF command signal VS (to the left as viewed in FIG. 32).

The circuit shown in FIG. 32 will operate as follows in an abnormal state where the main circuit current (collector current) IC of IGBT 4 in the ON state described above increases abnormally on account of a fault in the main circuit such as shorting of the load. In such a fault occurs, the drop in the forward voltage (collector-emitter voltage) of IGBT 4 also increases as a result of the increase in collector current IC. This permits diode 15 to return to an OFF state and the capacitor terminal voltage VC will again increase gradually from the clamp voltage in the normal state to a new value of clamp voltage. In the eighth embodiment of the present invention, the process of this gradual increase in VC is designed in such a way that VC will eventually reach the sum of the zener voltage of zener diode 13 and the base-emitter voltage of overcurrent detecting transistor 14.

This design offers the following advantage. When zener diode 13 and hence overcurrent detecting transistor 14 turns on, front-stage transistor 45 turns off, causing forward bias applying transistor 9 to turn off. On this occasion, the gate-emitter of IGBT 4 is essentially unbiased since reverse bias applying transistor 10 remains off and the value of resistance 55 is adequately greater than the value of (gate) resistance 11. The charge between the gate and emitter of IGBT 4 is removed through resistors 11 and 55 and through OFF gate voltage supply source 7 at a sufficiently slow speed to enable the operator to select an appropriate time for turning IGBT 4 off.

Figure 33:
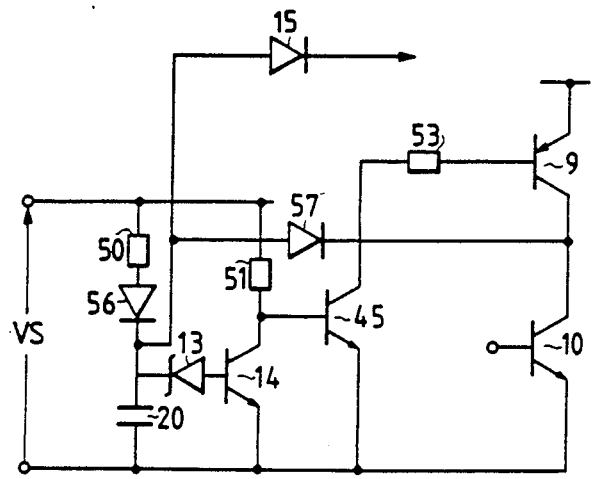
FIG. 33 is a circuit diagram showing a tenth embodiment of the present invention.

FIG. 33 shows the tenth embodiment of the present invention and it differs from the ninth embodiment in that an anti-oscillation diode 56 is added to the circuit for charging capacitor 20 in FIG. 32. Further, diode 57 is added to insure that when IGBT 4 is off (i.e., when reverse bias applying transistor 10 is on), capacitor 20 is discharged and the charge in it is transferred to transistor 10 via diode 57 to bring said capacitor to the initial state.

Figure 34:
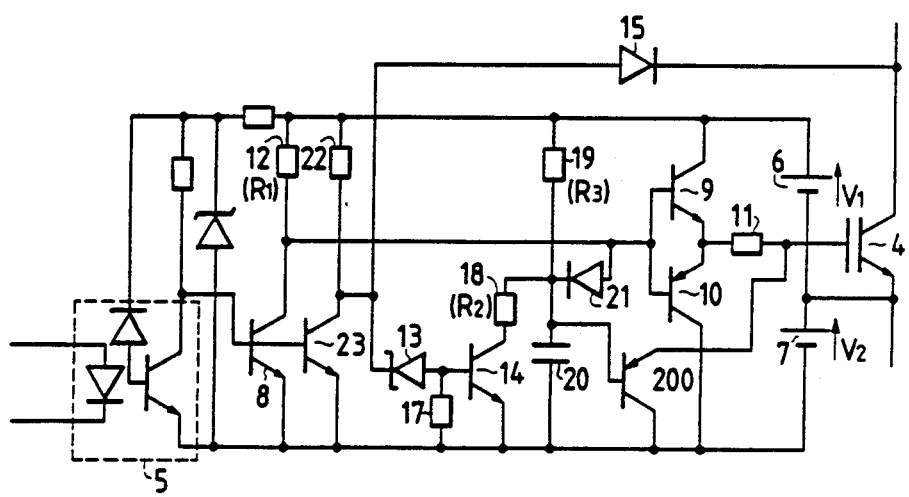
FIG. 34 is a circuit diagram showing a eleventh embodiment of the present invention.

FIG. 34 shows an eleventh embodiment, in which the gate resistor 11 at the side of the IGBT 4 is connected to the positive side of the capacitor 20 through a transistor 200 in the circuit of the fourth embodiment shown in FIG. 27. More specifically, an emitter terminal of the transistor 200 is connected to the gate resistor 11 and a base terminal thereof is connected to the positive terminal of the capacitor 20.

In the circuit shown in FIG. 34, when an overcurrent is detected, the transistor 14 is turned on. When the transistor 14 is turned on, the voltage of the capacitor 20 is discharged through the resistor 18 and the transistor 14. Since the voltage of the capacitor 20 is also $V_{BE}$ (base-emitter voltage), when the voltage of the capacitor 20 is discharged, $V_{BE}$ of the transistor 200 becomes lower than $V_{CE}$ (collector-emitter voltage) thereof so that the transistor 200 is turned on. When the transistor 200 is turned on, a voltage difference between the voltage across the capacitor 20 and $V_2$ is applied between the gate-emitter of the IGBT 4 through the transistor 200. Further, since a fluctuation current flows to the transistor 200, the gate-emitter voltage is not charged. As a result, the overcurrent protecting operation is firmly conducted.

As described on the foregoing pages, the circuit of the present invention for driving a voltage-driven semiconductor device is capable of suppressing the destructive voltage due to the interruption of an overcurrent which develops in ground fault and other shorting accidents to the device. Further, this circuit reduces the energy consumption of the faulty device, thereby insuring complete protection of the device from the overcurrent.

While a pair of transistors are used at the output stage, one transistor for turning on the device may be replaced by an FET. In this case, a predetermined gate voltage can be applied to the device, thereby reducing the power loss it might experience. An added advantage of using FET is that there is no need to increase the size of the gate drive circuit since a single common circuit suffices for driving a broad capacitance class of semiconductor devices.

Further, when the voltage-driven semiconductor device is on, checking is made as to whether the collector-emitter voltage of the device has exceeded a predetermined level on account of overcurrent and if the result is positive, the forward bias applying transistor is turned off and the charge between the gate and emitter of the device is gradually removed through the discharging resistor, with the gate-emitter of the device being kept essentially unbiased. This permits the semiconductor device to turn off at such a slow speed that the rate of change of current (di/dt) in the main circuit in the device decreases sufficiently to insure that the voltage being applied to the device will not exceed the level it can safely handle.

What is claimed is:

1. In a common drive output circuit for driving dissimilar switching semiconductor devices having different drive input characteristics by turning on and off dc power supplies to apply a voltage between drive input terminals of either one of said switching semiconductor devices through two transistors connected in a Darlington pair, the improvement wherein a collector circuit of one of said two transistors which is not at the output stage has a diode inserted in series which has such a polarity as to permit passage of the collector current.

2. A gate drive circuit for use with a voltage-driven semiconductor device, comprising:
    a reflux diode connected in series and in opposite direction to the output side of said drive circuit;
    a constant voltage circuit that supplies a gate of said semiconductor device with a voltage that is higher than a threshold voltage of said semiconductor device but which is lower than a voltage applied in a steady state; and
    a timer that allows said constant voltage circuit to operate, when said semiconductor device is on, for at least the period of time by which a reverse recovery time of said diode lapses.

3. A gate drive circuit for use with a voltage-driven semiconductor device, comprising:
    a reflux diode connected in series and in opposite direction to the output side of said drive circuit; and
    a pair of switching elements at the output stage that operate in a complementary way to turn on and off said semiconductor device;
    wherein one of said switching elements for turning on the semiconductor device has a shorter switching time than the other for turning off the semiconductor device in such a way that when said semiconductor device is on, said two switching elements turn on simultaneously for a certain period of time which is at least longer than the reverse recovery time of the reflux diode, a gate of said semiconductor device being supplied with a voltage that is higher than a threshold voltage of said semiconductor device but lower than a voltage applied in a steady state.

4. A drive circuit for use with a voltage-driven semiconductor device, comprising
a drive section having as constituent elements at least a signal insulating photocoupler and a pair of complementary output transistors; and
a protecting section for protecting said voltage-driven semiconductor device from overcurrent that develops when a shorting accident occurs in said device being driven;
wherein said protecting section is composed of detection means that monitors a voltage at the input main terminal of said voltage-driven semiconductor device in the presence of a drive signal and which produces a detection signal if said voltage exceeds a predetermined level, and a variable voltage source that gradually lowers the voltage with time while said detection means is operating, with a diode being connected between said variable voltage source and the base terminal of each of said output transistors in such a way that an anode is directed to said base terminal.

5. A drive circuit for use with a voltage-driven semiconductor device, comprising:
a drive section having as constituent elements at least a signal insulating photocoupler and a pair of complementary output transistors;
detection means that monitors a voltage at an input main terminal of said voltage-driven semiconductor device in the presence of a drive signal and which produces a detection signal if said voltage exceeds a predetermined level; and
a variable voltage source that gradually lowers the voltage with time while said detection means is operating;
wherein said drive circuit further includes a transistor which conducts when said detection means senses that the voltage at the input main terminal of said voltage-driven semiconductor device has exceeded a predetermined level in the presence of a drive signal and a collector terminal of which is connected to a collector terminal of said signal insulating photocoupler via a diode the forward direction of which is toward said transistor.

6. A drive circuit for use with a voltage-driven semiconductor device, comprising
a drive section having as constituent elements at least a signal insulating photocoupler and a pair of complementary output transistors; and
a protecting section for protecting said voltage-driven semiconductor device from overcurrent that develops when a shorting accident occurs in said device being driven;
wherein the pair of complementary output transistors in said drive section consists of an FET as a transistor for turning on said device and a bipolar transistor as a transistor for turning it off.

7. A drive circuit for use with a voltage-driven semiconductor device, comprising
a drive section having as constituent elements at least a signal insulating photocoupler and a pair of complementary output transistors;
a protecting section composed of detection means that monitors a voltage at an input main terminal of said voltage-driven semiconductor device in the presence of a drive signal and which produces a detection signal if said voltage exceeds a predetermined level and a variable voltage source that gradually lowers the voltage with time while said detection means is operating;
wherein a positive electrode terminal of a capacitor as a component of said variable voltage source in said protecting section is connected to a gate terminal of said voltage-driven semiconductor device via a diode.

8. A drive circuit for use with a voltage-driven semiconductor device, comprising:
a drive section having as constituent elements a pair of output transistors consisting of a forward bias applying transistor that applies a forward voltage between gate and cathode of said voltage-driven semiconductor device to turn it on and a reverse bias applying transistor that applies a reverse voltage between the gate and cathode of said device to turn it off;
detection means that monitors a voltage at an input main terminal of said device in the presence of a drive signal and which produces a detection signal if said voltage exceeds a predetermined level;
means that inactivates said forward bias applying transistor when the detection signal is produced by said detection means so as to remove the forward voltage applied; and
a resistor that becomes effective with at least the applied forward voltage being removed and without any reverse voltage being applied on account of inactivation of said reverse bias applying transistor and which forms a shunt between the gate and cathode of said semiconductor device.

* * * * *